(12) United States Patent
Maeda et al.

(10) Patent No.: US 6,423,558 B1
(45) Date of Patent: Jul. 23, 2002

(54) METHOD FOR FABRICATING INTEGRATED CIRCUIT (IC) DIES WITH MULTI-LAYERED INTERCONNECT STRUCTURES

(75) Inventors: Yasuhiro Maeda; Masahiro Ishida; Takahiro Yamaguchi, all of Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/512,780

(22) Filed: Feb. 25, 2000

(51) Int. Cl.[7] .......................... G01R 31/26; H01L 21/66
(52) U.S. Cl. ............... 438/17; 438/14; 438/18
(58) Field of Search .................. 438/14–18, 618, 438/622, 631, 633, 637

(56) References Cited

U.S. PATENT DOCUMENTS

| | | | |
|---|---|---|---|
| 4,924,589 A | * | 5/1990 | Leedy ........................... 438/6 |
| 5,399,505 A | * | 3/1995 | Dasse et al. .................. 438/17 |
| 5,899,703 A | * | 5/1999 | Kalter et al. .................. 438/18 |
| 6,054,334 A | * | 4/2000 | Ma .............................. 438/14 |

* cited by examiner

*Primary Examiner*—Matthew Smith
*Assistant Examiner*—Craig P. Lytle
(74) *Attorney, Agent, or Firm*—David N. Lathrop; Gallagher & Lathrop

(57) ABSTRACT

In a method for fabricating an LSI in which primitive devices such as transistors are formed on a semiconductor substrate and a plurality of interconnect layers are formed thereover to provide sub-circuits of successively larger scale and increasing complexity including sub-circuits which are formed by a connection of the primitive devices and sub-circuits of a larger scale which are formed by a connection of the sub-circuits, under a condition that an intermediate interconnect layer is formed, an exhaustive test, a functional test, a stuck-at fault test, a quiescent power supply current test or the like takes place with respect to the primitive devices or the sub-circuits which are wired together by the intermediate interconnect layer, and subsequently, a wiring connection test takes place after the formation of each subsequent interconnect layer. A fault coverage is improved while a testing cost and a fabricating cost are reduced.

4 Claims, 17 Drawing Sheets

NAND Gate          Inverter

Sub-circuit a          Sub-circuit b

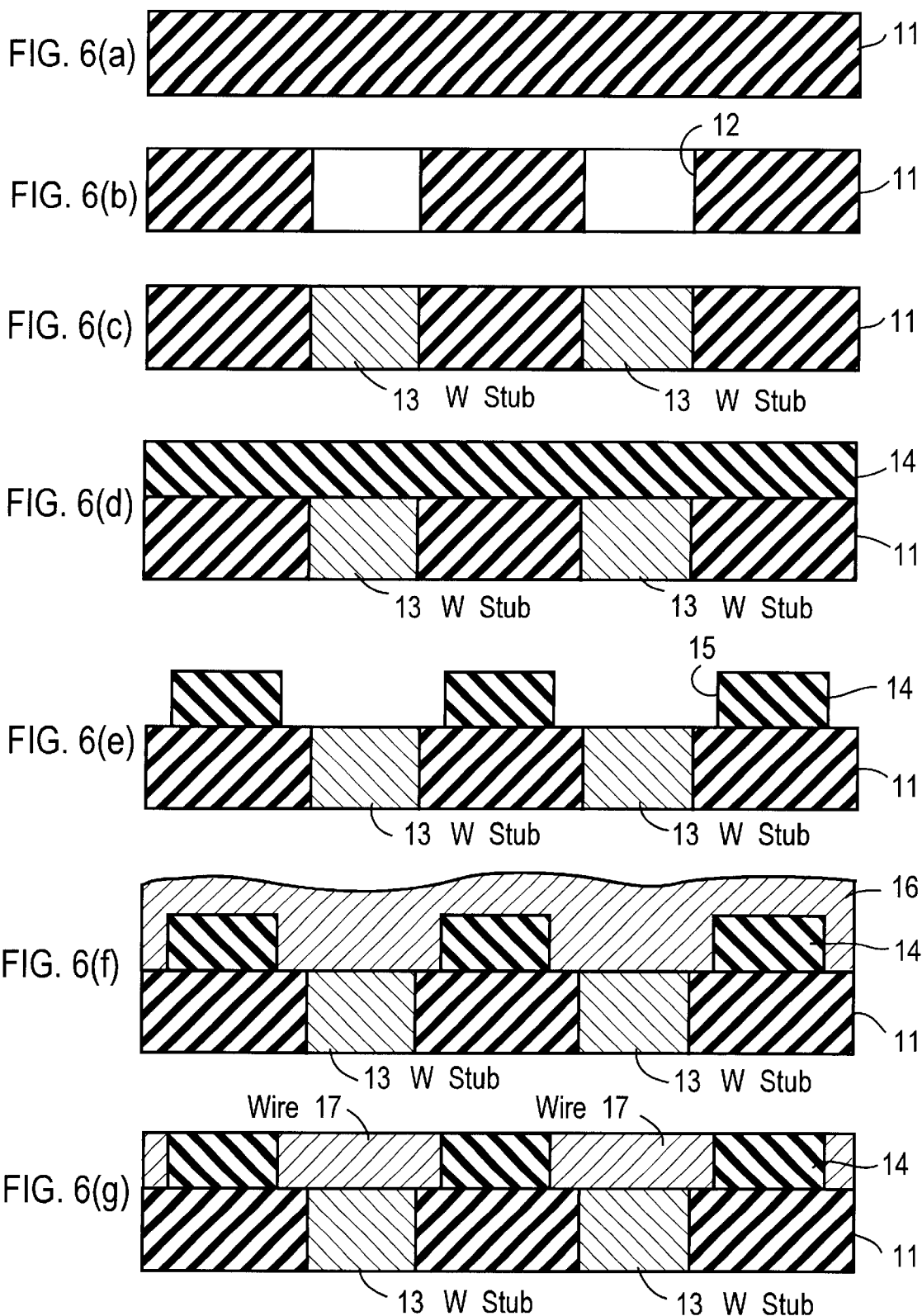

Integrated Circuit B

16bit counter

METHOD FOR FABRICATING INTEGRATED CIRCUIT (IC) DIES WITH MULTI-LAYERED INTERCONNECT STRUCTURES

BACKGROUND OF THE INVENTION

The present invention relates to a method for fabricating semiconductor integrated circuit dies with multi-layered interconnect structures.

A semiconductor integrated circuit of a high integration level comprises a plurality of stacked interconnect layers to define a plurality of sub-circuits having a variety of functions after primitive devices have been formed.

In FIG. 1, there is shown a semiconductor integrated circuit having a plurality of sub-circuits. A semiconductor integrated circuit A shown has a plurality of sub-circuits S1, S2, . . . , Sk (k=6 in the example shown in FIG. 2). Sub-circuits may be large scale functional blocks such as CPU, memory, DSP, AD converter, I/O interface or the like, or may be relatively small scale or basic sub-circuits such as adder, multiplier, multiplexer, flip-flop or the like. In addition , the functional blocks and sub-circuits may be digital circuits, analog circuits or mixed signal circuits.

The semiconductor integrated circuit A has a multi-layered interconnect structure comprising a plurality of interconnect layers (N-layers as shown in FIG. 2). A lowermost layer (the first interconnect layer) provides a wiring connection between primitive devices (transistors) formed in a semiconductor substrate, and is the interconnect layer which defines a basic logic gate, which is an NAND gate or an inverter in the example shown, as shown in FIG. 3. Input and output signal lines for the basic logic gates appear on the stacking surface of the first interconnect layer. Shown within blocks of this Figure which are indicated in broken lines are primitive devices, which do not appear on the surface of the first interconnect layer. The second interconnect layer provides a wiring connection between the basic logic gates which are formed by the first interconnect layer, and is the interconnect layer which defines relatively small scale sub-circuits as illustrated in FIG. 4, for example. Input and output signal lines for the sub-circuit appear on the surface of the second interconnect layer, but logic gates or inverters which constitute such circuits do not appear there. The i-th interconnect layer ($3 \leq i \leq N-1$) provides a wiring connection between sub-circuits which have been formed up to the (i-1)-th interconnect layer, and is the interconnect layer which defines sub-circuits of a higher scale, and input and output signal lines for the sub-circuits of the higher scale appear on the stacking surface of the i-th interconnect layer. An uppermost layer (N-th interconnect layer) provides a wiring connection between sub-circuits (S1, S2, . . . , Sk) which are formed by the (N-1)-th interconnect layer, and is the interconnect layer which defines a semiconductor integrated circuit A. Only input and output signal lines for the semiconductor integrated circuit A appear on the stacking surface of the N-th interconnect layer, as shown in FIG. 5.

Stacking of individual interconnect layers takes place in a manner shown in FIG. 6. While not shown, a product from an immediately preceding step, namely a substrate in which primitive devices are formed or an immediately preceding interconnect layer is initially subject to a deposition thereon of an oxide layer 11 such as formed by $SiO_2$, as shown in FIG. 6(a).

Photolithography is applied to the oxide layer 11 to define a mask for junctions with wirings or primitive devices located directly below it, and then the reactive ion etching (RIE) technique is applied to form openings 12, as shown in FIG. 6(b). The openings 12 are then filled with a conductive material, for example, tungsten to form junctions (stubs) 13, as shown in FIG. 6(c). As shown in FIG. 6(d), an oxide layer 14 as formed by $SiO_2$ deposition Photolithography is applied to the oxide layer 14 to define mask and the reaction ion etching (RIE) technique is applied to form grooves 15 for regions to be wired, as indicated in FIG. 6(e). A layer 16 of a metal such as Al, W, Cu or the like is formed as shown in FIG. 6(f), and the metal layer 16 is then subject to a chemical-mechanical polishing (CMP) to expose the oxide layer 14. Wires 17 which fill the grooves 15 form a wiring 17 which is connected to the junctions 13 and also connected to the underlying interconnect layer, not shown, through the junctions 13.

Steps to stack an interconnect layer may follow a procedure shown in FIG. 7. In a similar manner as illustrated in FIG. 6, a condition as shown in FIG. 7(a) is prepared in which junctions 13 fill in an oxide layer 11. Subsequently, a metal layer 16 is formed over the entire surface as shown in FIG. 7(b), and the application of the photolithography and the RIE technique form wires 17 connected to the junctions 13, as shown in FIG. 7(c). An oxide layer 18 is then deposited over the entire surface as shown in FIG. 7(d), and the surface of the oxide layer 18 is planarized by CMP, as shown in FIG. 7(e). In this instance, when openings 12 are formed to provide the junctions 13, the openings 12 should contiguously extend to reach the wires in the underlying interconnect layer.

A method for fabricating a semiconductor integrated circuit with a multi-layered interconnect structure has been briefly described above. In a conventional method for fabricating a semiconductor integrated circuit, there has been no practice of testing primitive devices or sub-circuits which have been already formed in the course of the fabricating steps.

In other words, a test of the semiconductor integrated circuit has taken place by placing a probe in contact with bonding pads of a chip as shown in FIG. 8 after the steps of fabricating a semiconductor integrated circuit chip have been completed to provide an IC in a wafer condition, inputting externally a test pattern to input pads on the circuit under test, and observing a voltage response signal on a power supply pad of the circuit under test or a current response signal through a power supply pad of the circuit under test(wafer probing, die sort). Alternatively, a test pattern is externally input to an input terminal (pin) of the circuit under test and a voltage response signal on an output terminal (pin) of the circuit under test or a current response signal through a power supply terminal (pin) of the circuit under test is observed to perform a test of the semiconductor integrated circuit (package test or final test). Such tests will be hereafter referred to as final tests.

A final test of the semiconductor integrated circuit utilizes a stuck-at fault test, a delay fault test, a quiescent power supply current (IDDQ) test, a functional test, an exhaustive test and the like. The stuck-at fault test is a procedure which assumes a stuck-at fault on a signal line in the circuit under test (which is a fault where a logical signal value on the signal line is fixed to a certain value; a fault in which the signal value is fixed to "0" is referred to as stuck-at 0 fault while a fault in which the signal value is fixed to "1" is referred to as stuck-at 1 fault) by seeing an influence of a fault through the observation of a voltage signal on an output terminal of the circuit under test with respect to a given test pattern. The delay fault test is a procedure which assumes a delay fault in a signal propagation path or a logical gate in the circuit under test, or a fault that a time interval required for a signal to propagate through the signal propagation path or the logical gate (delay time) exceeds or undershoots a given value (a delay fault in the signal propagation path being referred to as a path delay fault and a delay fault in the logical gate as a gate delay fault), by seeing an influence of a fault through the observation of a voltage transition signal on an output terminal of the circuit under test with respect to a given series of test patterns. The quiescent power supply current test is a procedure which assumes a short-circuit fault across a plurality of signal lines in the circuit under test or a leak fault in a primitive device therein by seeing an influence of a fault through the observation of a quiescent current signal through a power supply terminal of the circuit under test with respect to a given test pattern. The functional test is a procedure which examines whether or not the circuit under test functions properly. The exhaustive test is a procedure which examines output responses of the circuit under test for every combination of signal values to input terminals and flip-flops of the circuit under test. For the stuck-at fault test and the functional test, a description is given, for example, in chapters 6 and 8 of M. Abramovici, M. A. Breuer and A. D. Friedman, Digital Systems Testing and Testable Design, IEEE Press, New York, 1990; for the delay fault test, a description is given, for example, in G. L. Smith, "Model for Delay Faults Based upon Paths, " Proceedings of IEEE International Test Conference, pp. 342–349, 1985 or C. J. Lin and S. M. Reddy, "On Delay Fault Testing in Logic Circuits," Transactions on Computer-Aided Design, CAD-6(5), pp.694–703, 1987; for the quiescent power supply current test, a description is given, for example, in S. Chakravarty and P. J. Thadikaran, Intuduction to $I_{DDQ}$ Testing, Kluwer Academic Publichers, Boston, 1997; and for transient power supply current test, a description is given, for example, in M. Sachdev, P. Jamssen. and V. Zieren, "Defect Detection with Transient Current Testing and its Potential for Deep Submicron ICs," Proceedings of IEEE International Test Conference, pp.204–213, 1998 or Y. Min and Z. Li, "$I_{DDT}$ Testing versus $I_{DDQ}$ testing," Journal of Electronic Testing: Theory and Applications (JETTA), vol. 13, No. 1, pp. 51–56, August 1998.

In order to facilitate the testing of the circuit under test, use is also made of a test facilitating design technique, which affords testing functions to the circuit under test such as the technique of built-in self test (BIST) function into the circuit under test, the test point insertion which is intended to improve the controllability and the observability of an internal status of the circuit, the scan design technique, the boundary scan and the like. A description of the test facilitating design techniques is given, for example, in chapters 9, 10 and 11 of M. Abramovivi, M. A. Breuer and A. D. Friedman, Digital Systems Testing and Tastable Design, IEEE Press, New York, 1990.

However, as the circuit integration level rises to a system LSI, for example, in which a memory, MPU, DSP, I/O interface and the like are integrated into a single chip, the number of faults which would be subject to tests such as the stuck-at fault test, the delay fault test and the quiescent power supply current test will be enormous, prohibiting a testing of all of these faults in a practicable length of time. In addition, for the exhaustive test, the number of status corresponding to the number of internal flip-flops increases as an exponential function, making it very difficult to conduct such test. Furthermore, as the circuit scale increases, an increase in the number of functions contained in the circuit under test results in a tremendous figure for the number of test patterns which are required to test every function in the circuit under test.

As described above, if it is desired to test functions of the circuit under test by the final test, an increased length of time is required, and the testing cost of the final test increases. On the other hand, a large scale integrated circuit cannot be subject to testing all of the stuck-at faults, delay faults and short-circuit faults, presenting a problem that a high fault coverage rate cannot be obtained.

What is added is the fact that a rate of increase in the number of pins of an IC package is low in comparison to the rate of improving the integration level of a semiconductor integrated circuit, and this means that an external access to signal lines within the circuit will be further difficult in future, rendering the final test of the semiconductor integrated circuit very expensive.

It is also to be noted that the prior art procedure of testing the semiconductor integrated circuit by the final test involves problems that it is impossible to detect a poor work or a poor function which occurs during fabricating steps, that it is difficult to identify a sub-system which is highly likely to give rise to a fault, and that it is difficult to acquire data on a device level or a sub-system level which are useable in a simulation or a modelling which is intended for purpose of improving a system performance.

On the other hand, the test facilitating design technique, while allowing an external access to be dispensed with or simplified and facilitating a testing of the circuit under test, suffers from drawbacks of an increased overhead for the chip area, a degradation in the performance of the semiconductor integrated circuit under test which is caused by a testing circuit, a fault coverage which is less than desired, an increased length of time required for the test, etc.

Accordingly, there is a need for a testing method which allows the testing cost to be reduced and a testing method which is capable of achieving a higher fault coverage for a large scale semiconductor integrated circuit.

It is an object of the present invention to provide a method for fabricating a semiconductor integrated circuit with a multi-layered interconnect structure which allows a testing cost to be reduced or which allows a fault coverage for a circuit under test to be improved.

SUMMARY OF THE INVENTION

In accordance with a method according to the invention, a method for fabricating a semiconductor integrated circuit with a multi-layered interconnect structure by repeating a step of stacking interconnect layers (an interconnect layer stacking step) a plurality of times after primitive devices have been formed is characterized by the inclusion of a testing step of successively testing one or more sub-circuits which have been interconnected up to at least one or more intermediate interconnect layer stacking steps among the plurality of the interconnect layer stacking steps.

With this method, the cost of testing a circuit can be reduced, the fault coverage within the circuit can be improved, and a fault-free semiconductor integrated circuit can be fabricated.

It is desirable that the testing step in the fabricating method for the invention be conducted such that during a first testing step, one or more sub-circuits which have been interconnected up to the preceding stacking step be tested, and during a subsequent testing step, the interconnection between the sub-circuits be tested.

It is also desirable that the testing step in the fabricating method for the invention be conducted such that during a relatively early testing step of a given stack stage, one or more sub-circuits of a relatively small scale which have been interconnected by preceding stacking steps be tested, and during a subsequent testing step for the final layer, a final functional test of an integrated circuit which is finally interconnected be conducted.

It is also desirable that the fabricating method according to the invention includes a CMP (chemical mechanical polishing) planarizing step to planarize a stacking surface before transferring into a succeeding stacking step subsequent to the testing step.

It is also desirable that the fabricating method according to the invention includes a testing of the semiconductor integrated circuit by using the test facilitating design technique in the testing step, and a subsequent removal of a wiring to a testing circuit of the test facilitating design technique which is used in the testing step.

It is also desirable that the fabricating method according to the invention comprises a step of confirming whether or not a given step has been completed upon termination of an interconnect layer stacking step, transferring to the testing step if the completion has been confirmed, and transferring to a next stacking step if the completion has not been completed;

and a step of confirming whether or not the steps of fabricating a semiconductor integrate circuit have been completed upon termination of the testing step and transferring to a next stacking step when the completion is not found.

It is also desirable that the fabricating method according to the invention comprises a step of confirming whether or not a given step has been completed upon termination of a stacking step, transferring to a first testing step which tests a plurality of primitive devices or sub-circuits which have been formed and interconnected up to the given step when the completion is found, and transferring to a next stacking step when the completion is not found; a step of transferring to a next stacking step subsequent to the first testing step; a step of confirming whether or not a given interconnect layer stacking step has been completed after the first testing step, transferring to a second testing step which tests an interconnection for a plurality of wirings between the plurality of sub-circuits which have been connected up to the given stacking step when the completion is found, and transferring to a stacking step which follows the first testing step when the completion is not found; and a step of confirming whether or not steps of fabricating a semiconductor integrated circuit have been completed, and transferring to a stacking step which follows the first testing step when the completion is not found.

BRIEF DESCRIPTION OF THE DRAWINGS

FIG. 6 shows cross sections illustrating an example of process steps of an interconnecting step;

DETAILED DESCRIPTION OF THE PREFFERED EMBODIMENT

Figure 9:
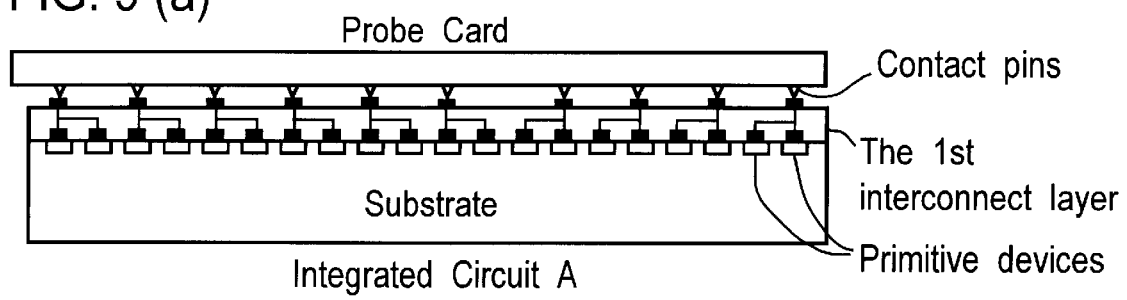
FIG. 9 shows cross sections illustrating a method for testing individual interconnect layers which represents an essential part of the method for fabricating a semiconductor integrated circuit according to the invention.
Figure 9:
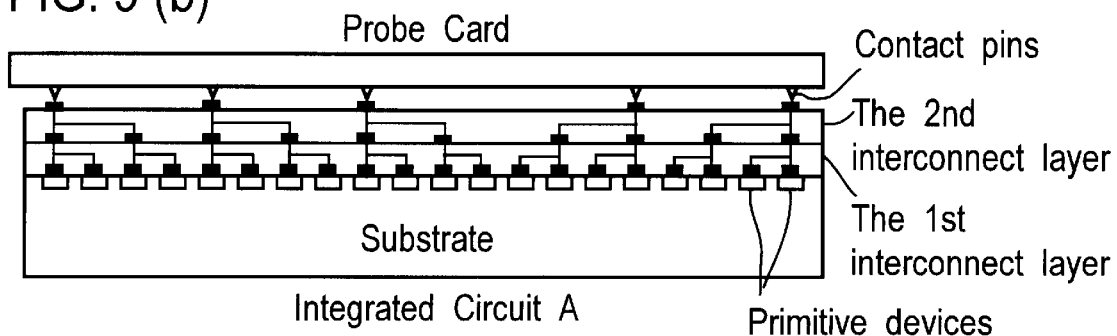
Figure 9:
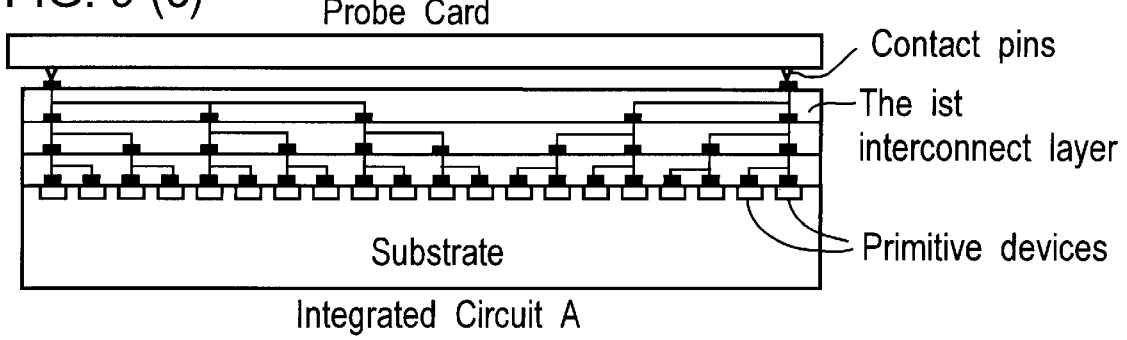
Figure 9:
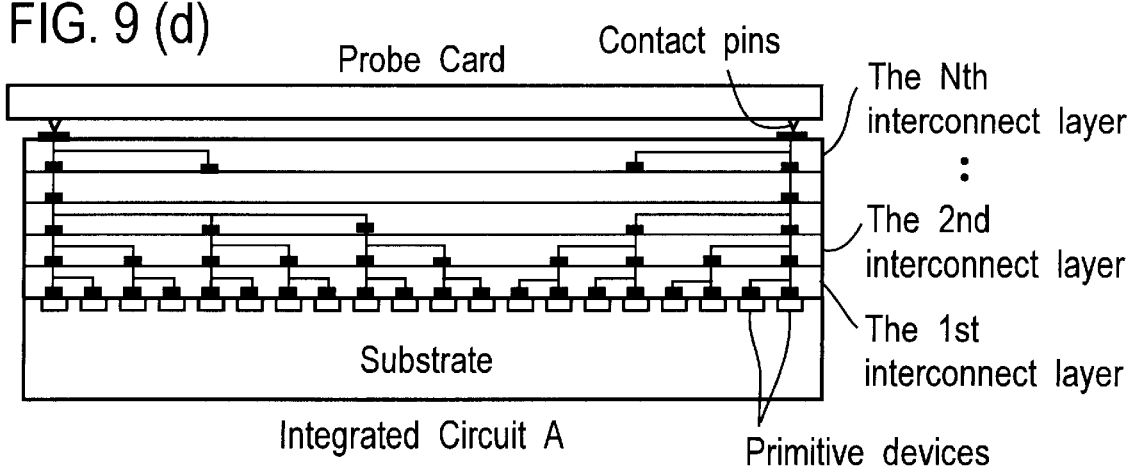

With a method for fabricating a semiconductor integrated circuit according to the invention, after a given intermediate stacking step or in the course of such step, a test is conducted by placing a probe in contact with a signal line or lines appearing on the stacking surface by using a probing means such as a probe card or the like. For example, a test for the level of basic logical gates on the stacking surface of a first interconnect layer as shown in FIG. 9(a), a test for the level of relatively small scale sub-circuits on the stacking surface of a second interconnect layer as shown in FIG. 9(b), or a test for the level of larger scale sub-circuits on the stacking surface of an i-th interconnect layer as shown in FIG. 9(c) may take place, and as required, a test of an overall semiconductor integrated circuit takes place on the stacking surface of an N-th interconnect layer. In addition, before the first interconnect layer is stacked, a test for the level of primitive devices or a measurement of element parameters of primitive devices may take place by placing a probe in contact with a substrate. A suitable value may be chosen for the number N of the interconnected layers depending on the scale and the layered structure of the circuit.

With the method for fabricating a semiconductor integrated circuit according to the invention thus constructed, a testing cost for a semiconductor integrated circuit can be reduced. The testing cost will be represented here in terms of the number of test patterns.

Figure 8:
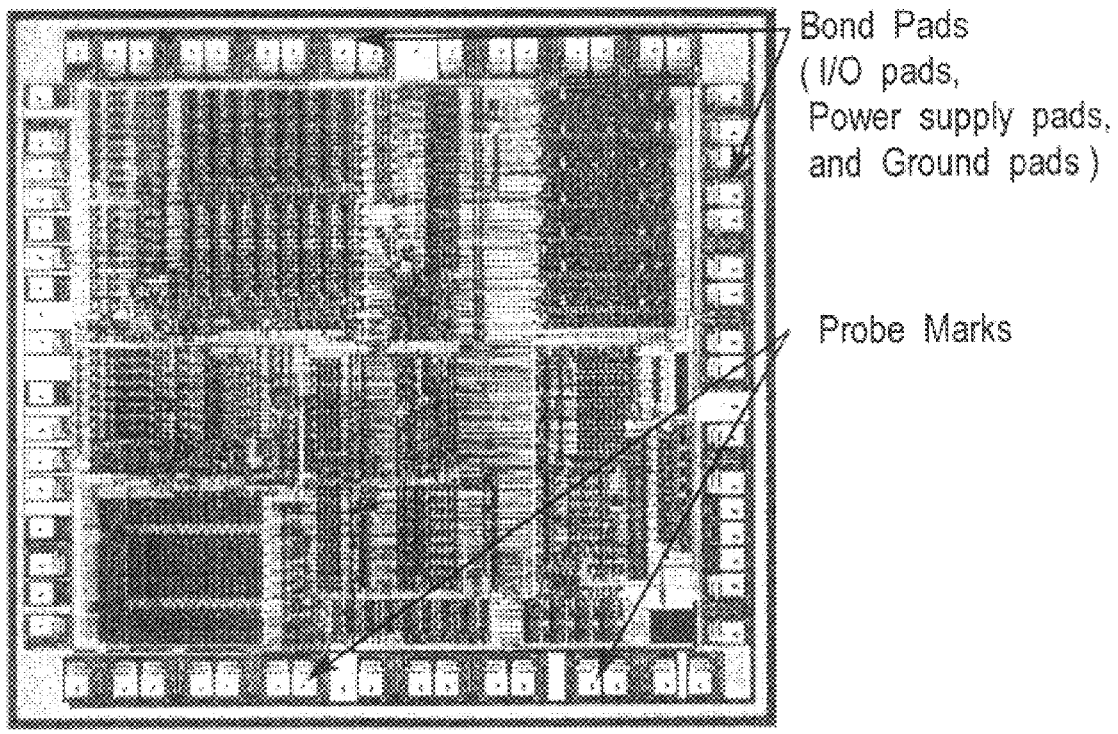
FIG. 8 is a view showing the surface of a semiconductor integrated circuit which illustrates a conventional semiconductor integrated circuit testing method.
Figure 10:
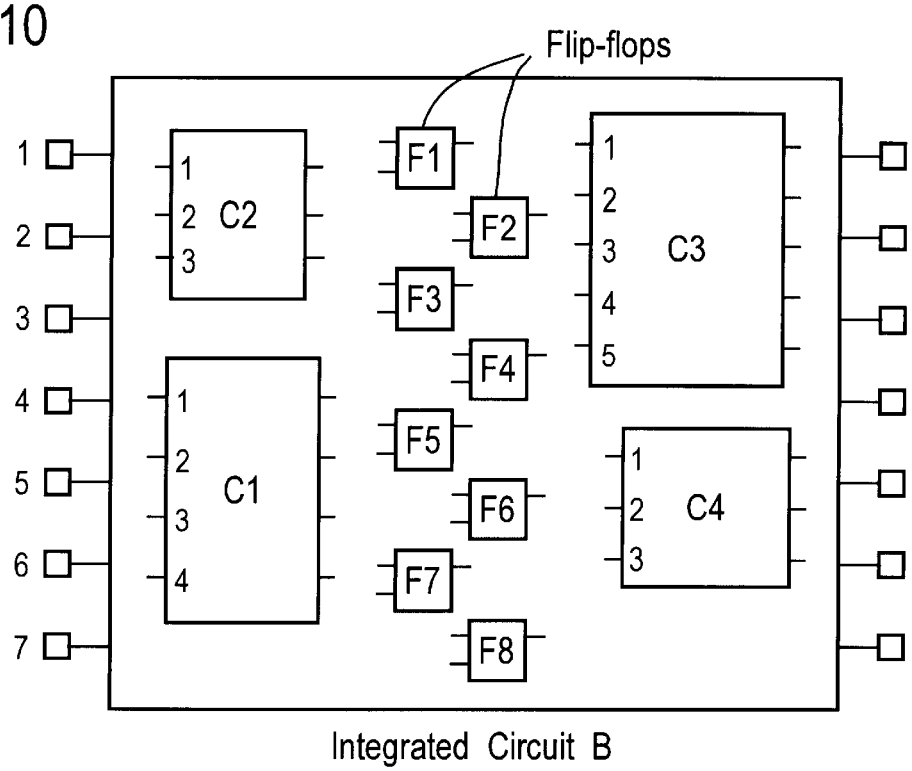
FIG. 10 is a diagram showing a semiconductor integrated circuit fabricated by the method for fabricating a semiconductor integrated circuit according to the invention.

An exhaustive test for a semiconductor integrated circuit B shown in FIG. 10 may be considered. The exhaustive test is a procedure which tests output responses of a circuit under test for every combination of signal values at input terminals of the circuit under test and at flip-flops. The semiconductor integrated circuit B comprises combinatorial circuits C1, C2, C3, C4 which do not contain flip-flops and m flip-flops circuits F1, F2, ..., Fm, all of which represents sub-circuits. Assume that the semiconductor integrated circuit B has a number of input terminals which is equal to t, and the combinatorial circuits or sub-circuits C1, C2, C3, C4 have numbers of input signal lines which are equal to p, q, r, s, respectively (in the example shown in FIG. 8, t=8, m=8, p=4, q=3, r=5, s=3). When the circuit is divided into combinatorial circuits and the flip-flops in the manner mentioned above, there is the following relationship between t, m, p, q, r and s:

$$t+m \geq p+q+r+s \quad (1)$$

In the exhaustive test of the semiconductor integrated circuit B, it is necessary that a test be conducted for every combination of logical signal values in t input terminals and m flip-flops, and accordingly, the number of tests amounts to $2^{t+m}$. Consequently, if a single test can be tested with a single test pattern, the number of test patterns N(B) will be equal to $2^{t+m}$.

$$N(B)=2^{t+m} \quad (2)$$

On the other hand, with a method for fabricating a semiconductor integrated circuit according to the invention, when a test of a sub-circuit is made each time such sub-circuit is formed, and similarly when each flip-flop is tested each time it is formed to perform the exhaustive test for the respective sub-circuits, numbers of test patterns N(C1), N(C2), N(C3), N(C4), N(F1), N(F2), ..., N(Fm) will be as given below.

$$N(C1)=2^p \quad (3)$$

$$N(C2)=2^q \quad (4)$$

$$N(C3)=2^r \quad (5)$$

$$N(C4)=2^s \quad (6)$$

$$N(F1)=2^{2+1} \quad (7)$$

$$N(F2)=2^{2+1} \quad (8)$$

$$\ldots$$

$$N(Fm)=2^{2+1} \quad (9)$$

It will be noted that because the flip-flop has two inputs and two internal status, the number of test patterns therefor will be equal to $2^{2+1}$. Accordingly, the number of test patterns N (Bsub) which are required to perform the exhaustive test for the level of sub-circuits will be given as follows:

$$N(Bsub)=2^p+2^q+2^r+2^s+8m \quad (10)$$

Accordingly, the number of test patterns in the testing step which is employed in the method for fabricating a semiconductor integrated circuit according to the invention can be reduced from the number of test patterns in the conventional test for the semiconductor integrated circuit by an amount given below.

$$N(B)-N(Bsub)=2^{t+m}-(2^p+2^q+2^r+2^s+8m).$$

(It will be seen from the equation (1) that when t and m are sufficiently large, N(B)−N(Bsub) will be positive.) For example, in the example where t=7, m=8, p=4, q=3, r=5 and s=3, the number of test patterns N (Bsub) for the exhaustive test against the second interconnector layer is as small as 120, as contrasted to the number of test patterns N(B)= 32768 for the uppermost layer, thus allowing the number of test patterns to be reduced as much as 32648 (which is approximately 99.6% of N(B)).

With the method for fabricating a semiconductor integrated circuit according to the invention, it is only needed that after a test for the level of sub-circuits is conducted, the sub-circuits be tested whether they are properly interconnected in the testing step for each interconnect layer up to the uppermost layer. Since it is only required to test the interconnection of the wiring under test by observing the propagated logical signal value, the number of test patterns which are required to perform such test is sufficiently small as compared with the number of test patterns which are used during the test of sub-circuits.

Figure 11:
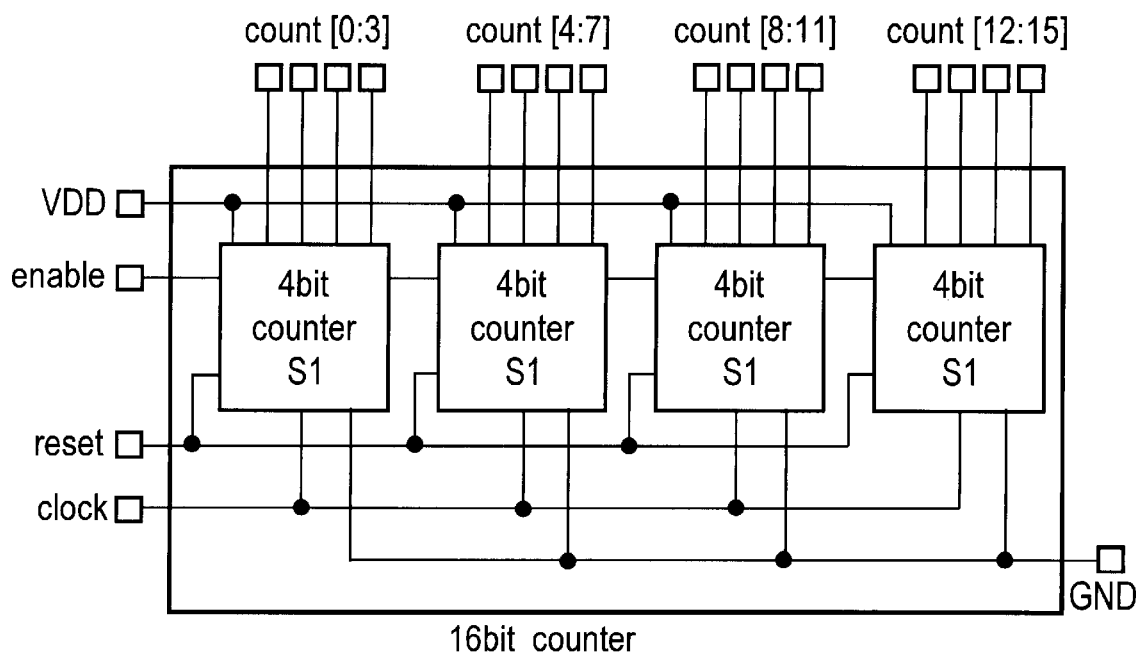
FIG. 11 is a diagram showing an example of a 16 bit counter fabricated according to the method for fabricating a semiconductor integrated circuit according to the invention.

To give another example, the functional test of a 16 bit counter formed by a semiconductor integrated circuit shown in FIG. 11 may be considered. The 16 bit counter has four 4bit counters S1, S2, S3 and S4 as sub-circuits.

In the functional test of the 16 bit counter, it is necessary to see if the 16bit output properly counts from 0000000000000000 to 1111111111111111, and hence the test requires a number of clocks (test patterns) which is equal to $2^{16}$=65536.

Figure 12:
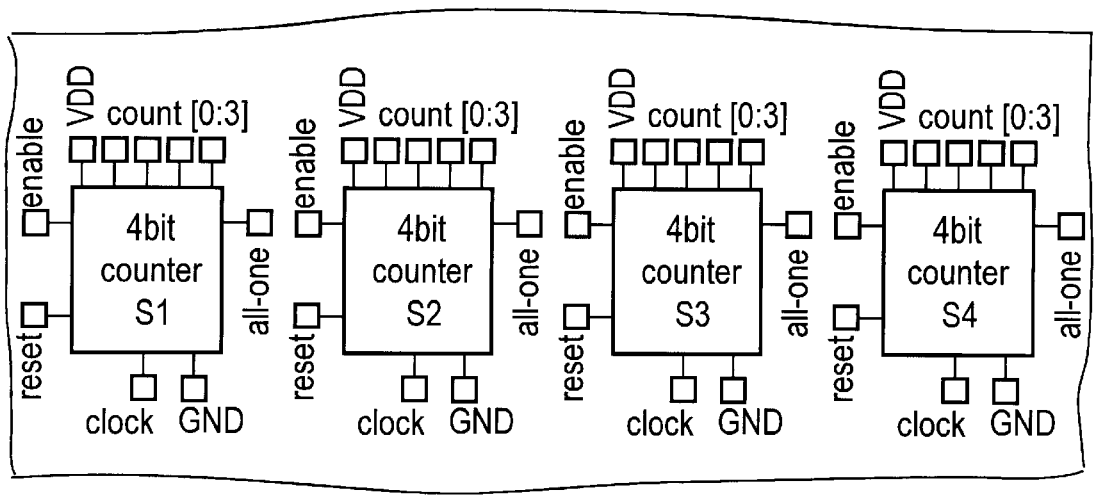
FIG. 12 is a diagram showing a condition during the fabrication of the 16 bit counter where 4 bit counters, representing sub-circuits, are formed.

On the other hand, with the method for fabricating a semiconductor integrated circuit according to the invention, when a k-th interconnect layer is formed to define 4 bit counters (sub-circuits) S1, S2, S3 and S4 as shown in FIG. 12, a probe is placed in contact with an input and output signal line of each 4bit counter which appear on the stacking surface of the k-th interconnect layer to perform a functional test of each of four sub-circuits S1, S2, S3 and S4. At this time, it is only required to see if a 4 bit output from each 4bit counter properly counts from 0000 to 1111, and accordingly, the test each requires $2^4$=16 clocks (test patterns).

Thus, the number of test patterns used in the testing step in the method for fabricating a semiconductor integrated circuit according to the invention can be reduced from the number of test patterns which are necessary when performing a test of 16 bit counter by an amount which is equal to 65536−4×16=65472 (99.9%).

The effect of reducing the testing cost will be more remarkably manifest for a larger scale circuit. In addition, such effect is not limited to the exhaustive test or the functional test, but a similar effect can also be obtained for the stuck-at fault test, the delay fault test, the quiescent power supply current test, the transient power supply current test and the like.

Figure 1:
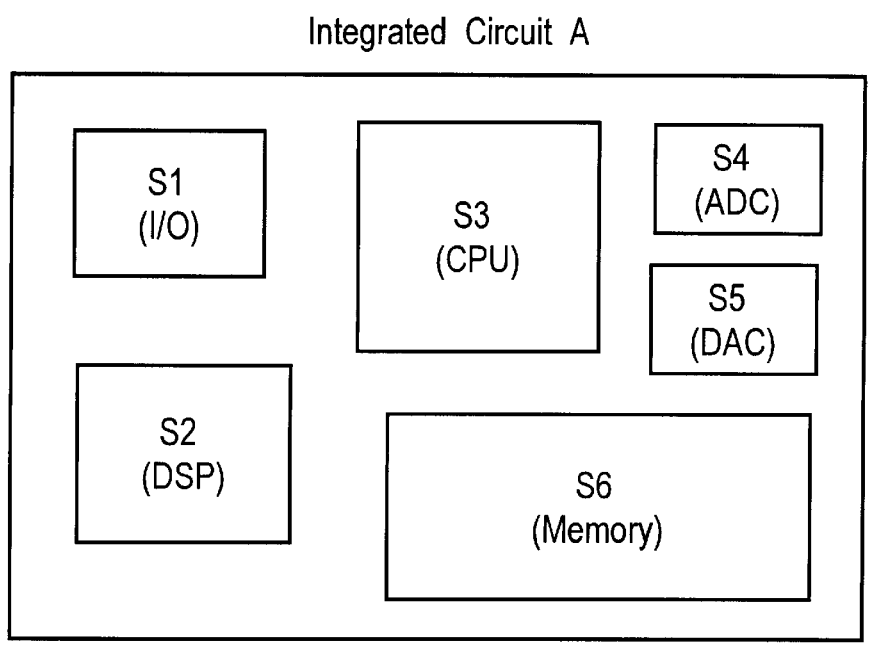
FIG. 1 is a diagram showing functional blocks of a semiconductor integrated circuit having a plurality of sub-circuits.
Figure 2:
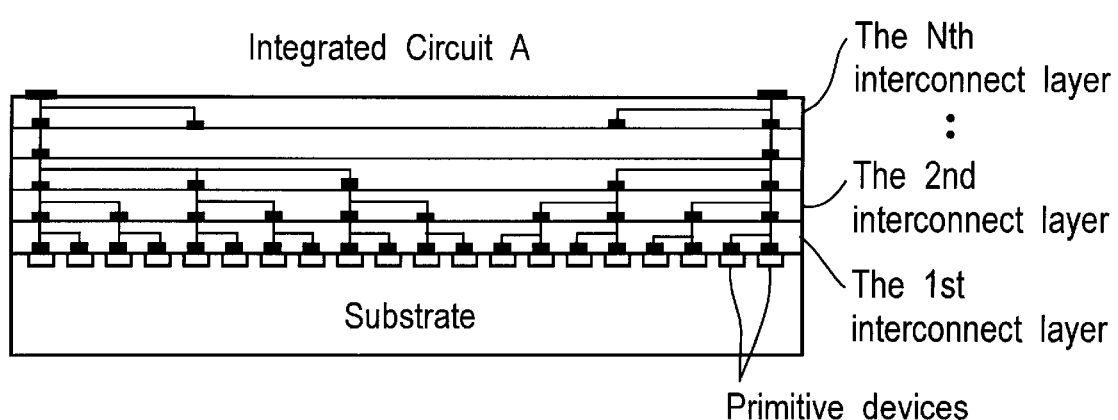
FIG. 2 is a cross section showing a multi-layer interconnect structure of the semiconductor integrated circuit having the plurality of sub-circuits.
Figure 3:
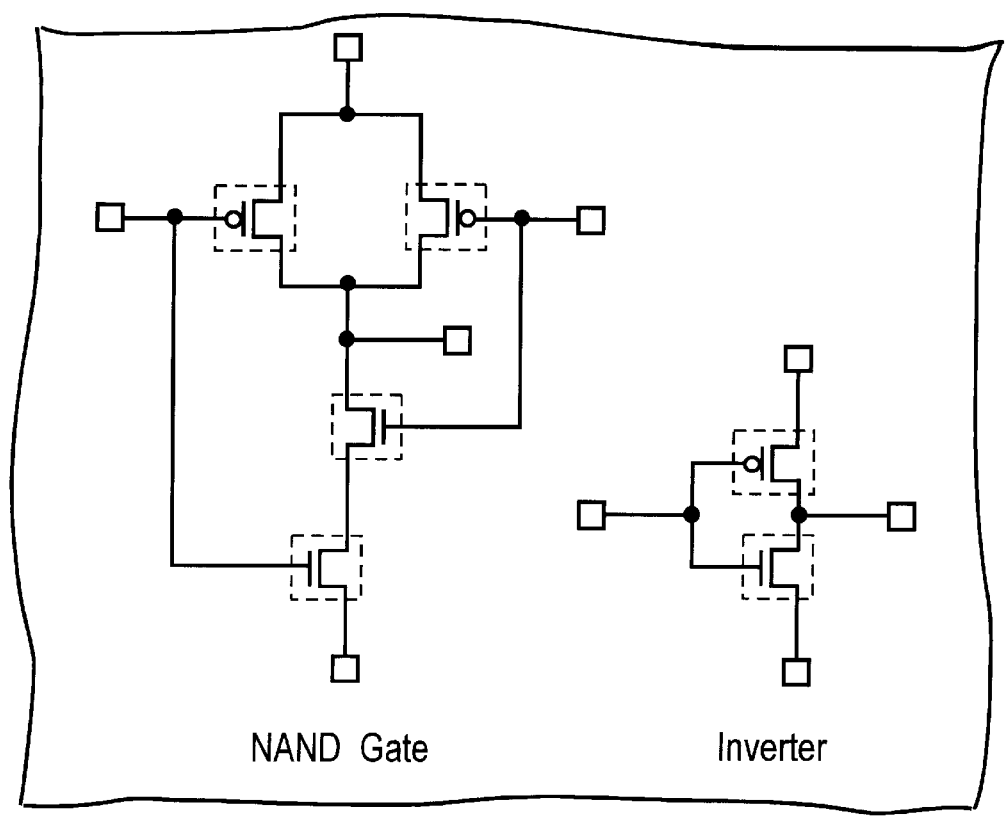
FIG. 3 is a diagram showing a plurality of basic logical gates formed by a first interconnect layer and signal lines appearing on the stacking surface of the first interconnect layer.
Figure 4:
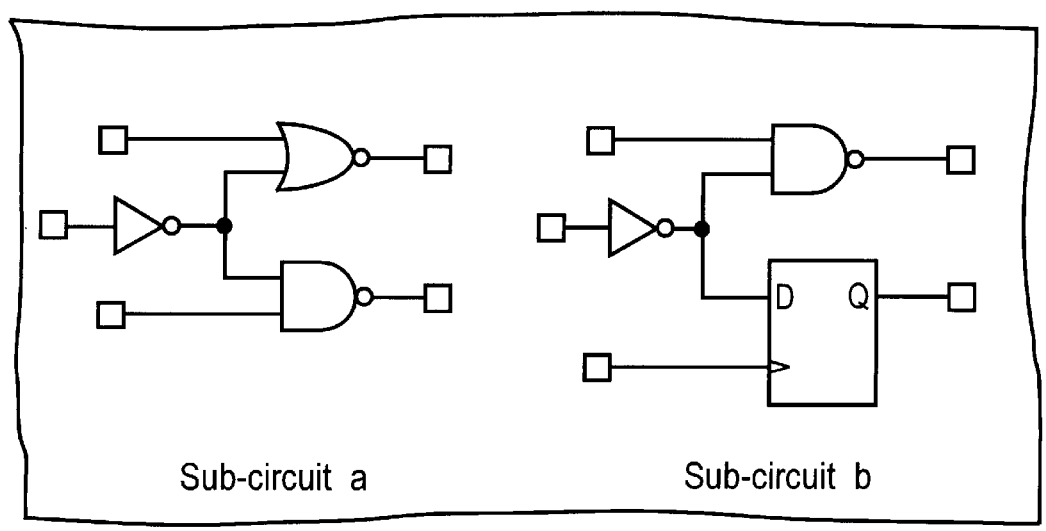
FIG. 4 is a diagram showing a plurality of sub-circuits formed by a second interconnect layer and signal lines appearing on the stacking surface of the second interconnect layer.
Figure 5:
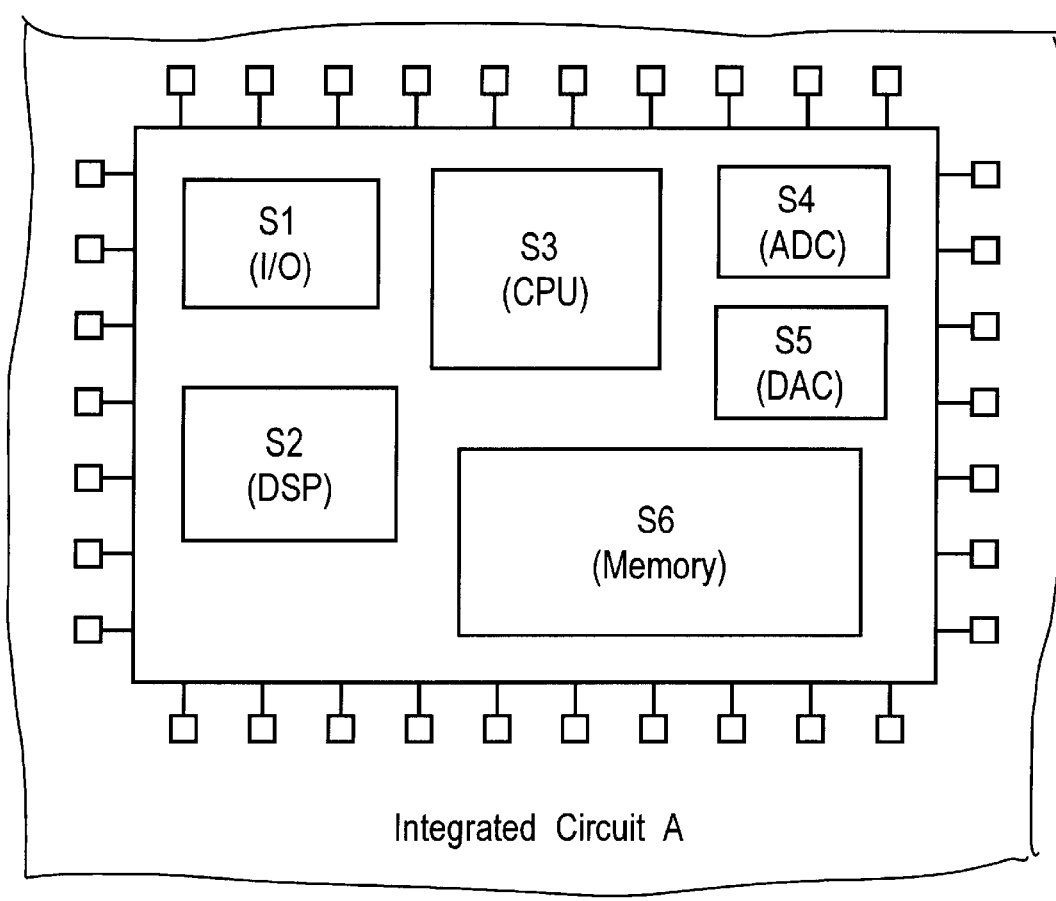
FIG. 5 is a diagram showing a semiconductor integrated circuit formed by an N-th interconnect layer and signal lines appearing on the stacking front of the N-th interconnect layer.

In addition, in the method for fabricating a semiconductor integrated circuit according to the invention, because each sub-circuit is tested separately during the testing step, when a plurality of sub-circuits are formed, these plural sub-circuits may be tested in parallel, thus allowing the testing time to be further reduced. Since the sub-circuit operate independently from each other unless they are wired together as shown in FIG. 4, a parallel test can be made by placing probes simultaneously in contact with a plurality of sub-circuits which appear on the same stacking surface.

With the method for fabricating a semiconductor integrated circuit according to the invention, the interposition of a testing step between intermediate multi-layer stacking steps allows the fault coverage to be improved and the reliability of the semiconductor integrated circuit to be improved. As the integration level of the circuit is increased, the number of stuck-at faults which are subject to the stuck-at fault test increases, and this combined with the presence of flip-flops in a sequential circuit renders an access to faulty locations within the circuit difficult. Specifically, because this requires a test pattern which is used to set up given signal values in respective flip-flops and another test patterns which propagate the influence of stuck-at fault to an output terminal through a plurality of flip-flops, the number of test patterns which are required to conduct the stuck-at fault test will be voluminous, making it difficult to apply the stuck-at fault test to a large scale integrated circuit so that the test can be completed within a practicable length of time. For this reason, a functional test is applied in substitution to the stuck-at fault test in order to test a large scale integrated circuit, but because the functional test is not explicitly designed to test the stuck-at faults, it is impossible to achieve a satisfactory fault coverage for stuck-at faults.

However, with the method for fabricating a semiconductor integrated circuit according to the invention, a testing circuit for the level of sub-circuits may be interposed under condition that smaller scale sub-circuits are formed during an intermediate fabricating step, thereby allowing a stuck-at fault test to be conducted for each sub-circuit within an practical length of time and thus allowing the fault coverage for the stuck-at faults for the entire circuit to be improved.

In a CMOS integrated circuit, as the miniaturization of circuit elements (MOS transistors) proceeds and the circuit tends to be integrated at a higher level, a leak current from a transistor increases, and accordingly, a quiescent power supply current for the entire chip increases, making it difficult to detect an increase in the quiescent power supply current which is caused by a single fault. Accordingly, the quiescent power supply current test is very difficult to perform in the larger scale CMOS integrated circuit. However, with the method for fabricating a semiconductor integrated circuit according to the invention, a test for the level of sub-circuits may be performed under a condition that smaller scale sub-circuits are formed, thereby allowing the quiescent power supply current test to be conducted for each sub-circuit and allowing the rate for detecting short-circuit faults and/or leakage faults over the entire circuit to be improved. Such effect is not limited to the stuck-at fault test or the quiescent power supply current test, but a similar effect can be obtained with respect to the delay fault test, the functional test, the exhaustive test, the transient power supply current test and the like as well.

In addition, with the method for fabricating a semiconductor integrated circuit according to the invention, a test interposed during the steps of fabricating a circuit enables an early detection of poor works such as disconnection faults or short-circuit faults and/or malfunctioning which results in an out-of-specification circuit performance, and a subsequent testing step or fabricating steps may be eliminated therefor, thus allowing the testing cost and the fabricating cost for the semiconductor integrated circuit to be reduced.

In addition, with the method for fabricating a semiconductor integrated circuit according to the invention, a test can be performed for the level of sub-circuit at the point when the sub-circuits are formed or for the level of sub-systems at the point when these sub-systems (relatively larger scale sub-circuits) are formed to allow a sub-system or sub-systems to be identified which are highly likely to give rise to a failure, and such information can be utilized to the incorporation of the test facilitating design technique, the scan design technique or the built-in self test (BIST) technique or to improving the reliability of the entire system, thereby allowing a system repair interval of an increased length (a time interval required to repair a faulty system into a normal system) to be reduced. For the test facilitating design techniques, a description is given, for example, in chapters 9, 10, 11 of M. Abramovici, M. A. Breuer and A. D. Friedman, Digital Systems Testing and Testable Design, IEEE Press, New York, 1990.

It will be noted that a simulation or a modeling to improve a system performance requires the acquisition of performance data such as delay times or current driving capabilities on a device level or on a sub-system level. With the method for fabricating a semiconductor integrated circuit according to the invention, a test which is conducted for a device level or sub-circuit level during the steps of fabricating the circuit allows such performance data on the device level or the sub-system level to be acquired.

In addition, the method for fabricating a semiconductor integrated circuit according to the invention allows an appropriate test to be applied to the sub-circuit level, thus avoiding the need to insert a testing circuit according to the test facilitating design techniques into the integrated circuit and thus allowing an area overhead which may be caused by such testing circuit to be reduced.

Furthermore, the method for fabricating a semiconductor integrated circuit according to the invention allows, by an effective utilization of CMP (chemical mechanical polishing) planarizing step, a degradation in the performance of the semiconductor integrated circuit which may be caused by the inserted testing circuit to be prevented if the test facilitating design technique is incorporated.

Figure 13:
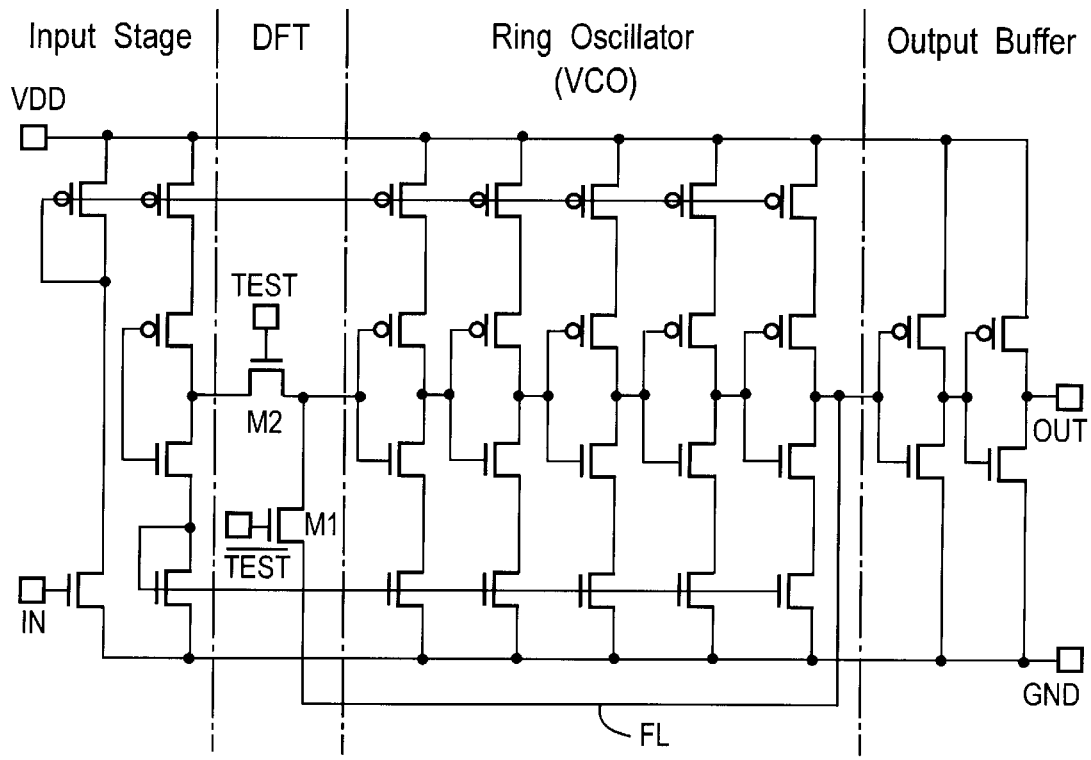
FIG. 13 is a diagram showing an example of VCO circuit having DFT circuit.

By way of example, a test facilitating design technique as shown in FIG. 13 has been proposed in order to facilitate a testing of a phase-locked loop (PLL). A description of this procedure is described, for example, in F. Azais, M. Renovell, Y Bertrand, A. Ivanov, and S. Tabatabaei, "A Unified Digital Test Technique for PLLs: Catastrophic Fault Covered," Proceedings of 5th IEEE International Mixed Signal Testing Workshop, pp. 269–292, June 1999. According to this procedure, two MOSFET's (M1, M2) are inserted as a DFT (Design for Test) circuit, between an input stage and an input of a voltage-controlled oscillator (VCO) which forms the PLL circuit. During a normal operation, MOSFET M1 is turned ON while MOSTET M2 is turned OFF, and an input to an output buffer is inputted to the input stage of the oscillator circuit, or a feedback loop FL is closed to form the VCO circuit. During the test, M1 is turned OFF while M2 is turned ON to disconnect the feedback loop FL in the VCO circuit, thus activating a path from the input terminal IN to an output terminal OUT for conducting a test. However, MOSFET (M1) is inserted in the feedback loop FL of the VCO circuit according to this procedure, a problem is presented that a resistance of MOSFET lowers the operational speed of the PLL circuit during the normal operation.

Figure 14:
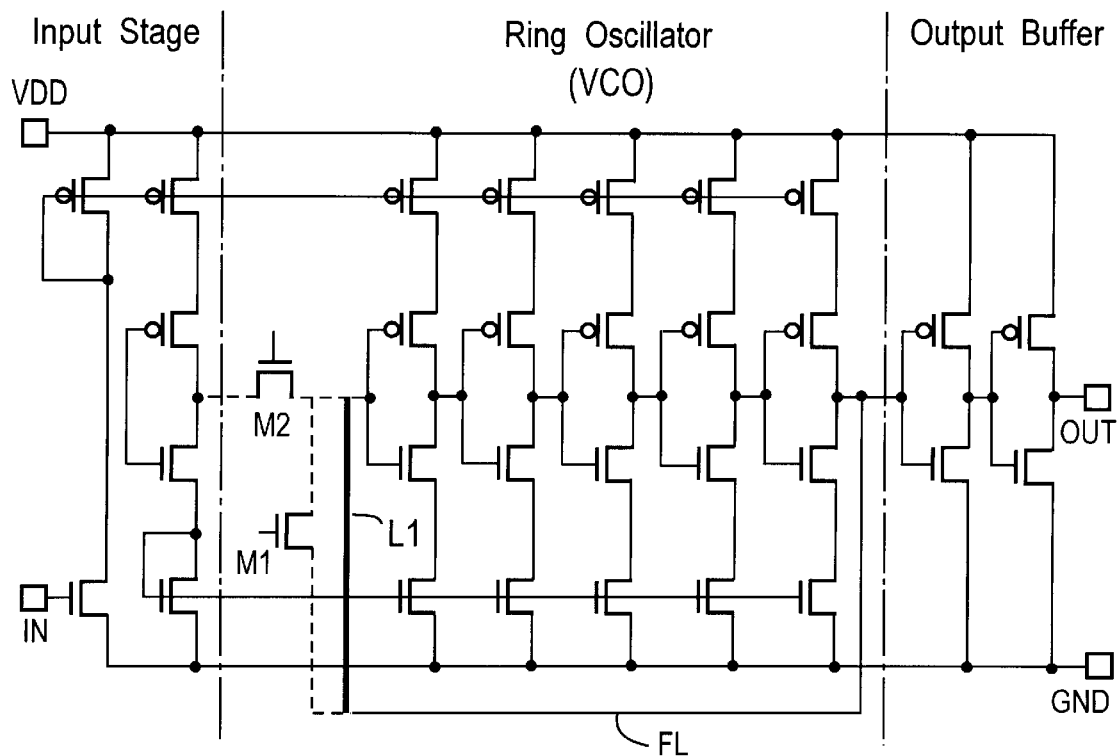
FIG. 14 is a diagram showing a VCO circuit which is reconfigured by the method for fabricating a semiconductor integrated circuit according to the invention.

By contrast, with the method for fabricating a semiconductor integrated circuit according to the invention, after an interconnect layer which connects M1 and M2 in the manner shown in FIG. 13 has been formed, a testing step may be interposed by placing a probe in contact with the wiring in the PLL under test to turn M1 OFF and to turn M2 ON in order to perform a test of the PLL circuit under test, and after the PLL circuit under test has been tested, the wiring to the testing circuit M1 and M2 shown in broken lines may be removed by CMP and a wiring L1 shown in solid line may be stacked anew, as shown in FIG. 14, thus reconfiguring a feedback loop in which M1 is removed, thus allowing a PLL circuit which is free from a degradation in the performance to be fabricated. In other words, an interconnect layer which comprises wirings shown in dotted lines in FIG. 14 is formed to provide a circuit arrangement shown in FIG. 13 to perform a test, and upon completion of the test, the interconnected layers shown in dotted lines is removed, and an interconnect layer which forms the wiring L1 to define the feedback loop is formed thereon. The reconfigured PLL circuit is already tested, and there is an assurance that it operates normally.

Figure 15:
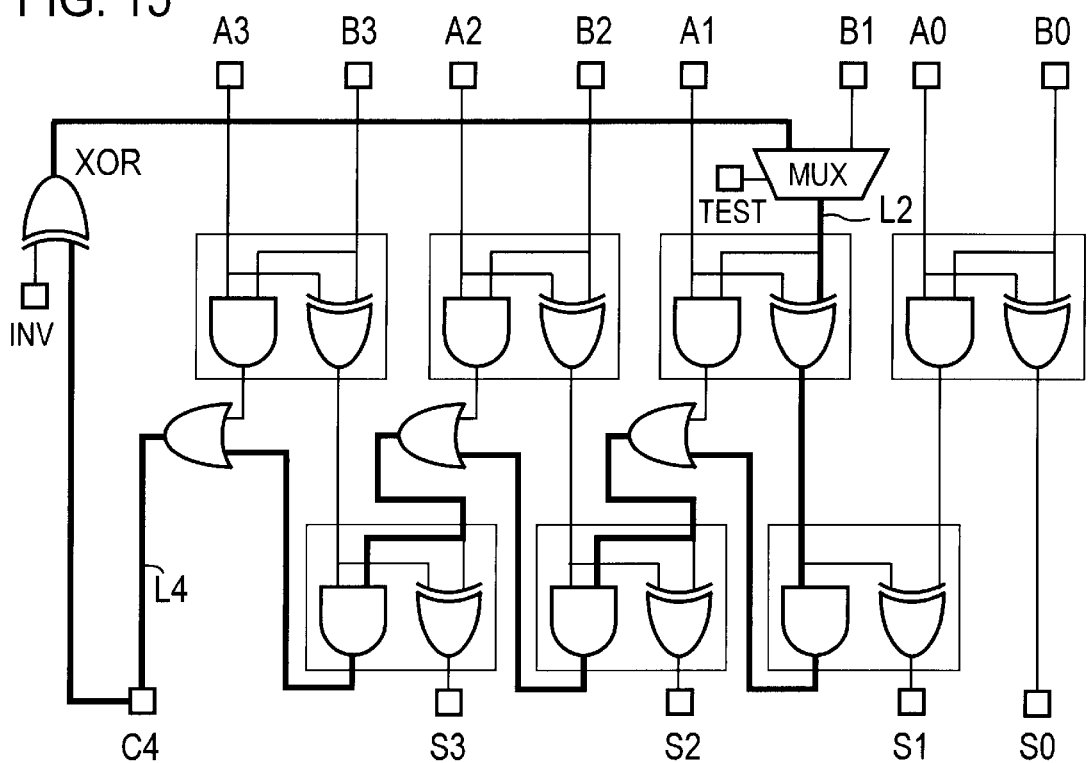
FIG. 15 is a diagram showing an example of a digital integrated circuit having TEST FACILITATING DESIGN circuit.

A test facilitating design technique as illustrated in FIG. 15 is also proposed to facilitate the delay fault test and the stuck-at fault test of a digital integrated circuit. This procedure is described, for example, in K. Arabi, H. Ihs, C. Dufaza and B. Kaminska, "Digital Oscillation-Test Method for Delay and Stuck-at Fault testing of Digital Circuits," Proceedings of IEEE International Test Conference, pp.91–100, Oct. 1999. This procedure comprises connecting an input signal line L2 and an output signal line L4 of a signal propagation path under test of a digital integrated circuit (or more generally, a critical path having a longest delay time is selected) through an XOR gate and a multiplexer in loop form as indicated in thick lines. During a normal operation, an input TEST of the multiplexer is controlled so that the feedback loop is deactivated, thus connecting B1 to L2 to operate the circuit under test while during the test, the multiplexer MUX is controlled to connect the output of the XOR gate to the input line L2 to define the loop, and input INV of the XOR gate is controlled to form a ring oscillator including an odd number of output inverting logical gates (output inverting gates) within the loop, thus testing the delay fault and the stuck-at fault on the critical path.

The XOR gate is used to control the number of output inverting gates on the feedback loop by providing "1" for the input INV to operate it as an output inverting gate when there is even number of output inverting gates on the critical path while providing "0" for the input INV when there are an odd number of output inverting gates on the critical path. For example, in FIG. 15, the number of output inverting gates on the critical path is equal to 0, and accordingly, during the test, INV="1" may be provided as an input. However, because the multiplexer and the XOR gate are connected to the input and the output of the digital semiconductor integrated circuit, there is a problem that the propagation delay time of the multiplexer MUX and the parasitic capacitance of the XOR gate cause the operational speed of the digital semiconductor integrated circuit to be lowered during the normal operation.

Figure 16:
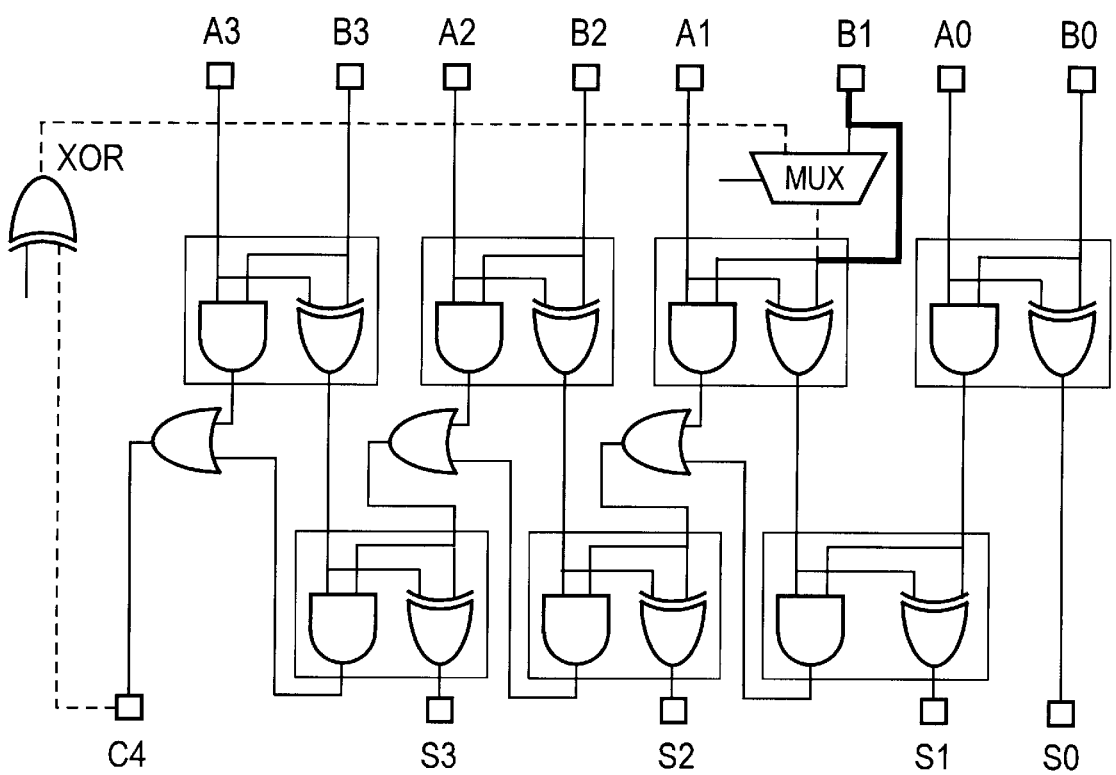
FIG. 16 is a diagram showing a digital integrated circuit which corresponds to FIG. 15 reconfigured according to the method for fabricating a semiconductor integrated circuit according to the invention.

By contrast, according to the method for fabricating a semiconductor integrated circuit of the invention, a testing step is executed under a condition that an interconnect layer which connects the testing circuit MUX, XOR is formed. A probe is placed in contact with the wiring in the digital semiconductor integrated circuit, a required input is applied to test the digital semiconductor integrated circuit, and subsequently, the testing circuit shown in dotted lines as shown in FIG. 16, namely, the interconnect layer leading to MUX and XOR is removed by CMP while an input signal line which is shown in a thick solid line is stacked anew. In this manner, a digital semiconductor integrated circuit which has been tested without accompanying degradation in the performance which may be caused by MUX and XOR can be fabricated. The digital semiconductor integrated circuit which is reconfigured in this manner is already tested, and is assured to operate in a normal manner.

It is desirable that a semiconductor integrated circuit with a multilayered interconnect structure which is subject to the fabrication according to the invention comprises a damascene interconnect structure. A damascene interconnect structure is described, for example, in A. K. Stamper, T. L. McDevitt, and S. L. Luce, "Sub-0.25-micron Interconnection Scaling: Damascene Copper versus Subtractive Aluminum," IEEE/SEMI Advanced Semiconductor Manufacturing Conference, pp. 337–346, 1998. It is to be noted that a wiring material is not limited to the copper (Cu), but may comprise copper-magnesium (Cu—Mg) or any other material. A semiconductor integrated circuit with a damascene interconnect structure is subject, subsequent to a given stacking step and before entering a succeeding stacking step, to a step of planarizing the stacking surface as shown in FIG. 6 (g), for example, to a CMP planarizing step. The planarizing step allows a miniscule scar of contact such as a minute dimple, which may be formed when a probe is placed in contact therewith during the testing step at an intermediate stage, which defines an essential feature of the invention, to be removed. Accordingly, the testing step which takes place during the fabricating steps can be implemented without any influence upon the steps of fabricating a semiconductor integrated circuit.

A semiconductor integrated circuit with a multi-layered interconnect structure which is subject to the fabrication according to the invention is not limited to a digital circuit, but may comprise an analog circuit or a mixed signal circuit comprising a mixture of a digital circuit and an analog circuit.

In addition, a semiconductor integrated circuit with a multi-layered interconnect structure which is subject to fabrication according to the present invention is not limited to single substrate semiconductor integrated circuit, but may comprise a semiconductor integrated circuit which is implemented in three dimensions by stack of a plurality of sub-substrates.

Also a semiconductor integrated circuit with a multi-layered interconnect structure which is subject to the fabrication according to the present invention is not limited to a single chip semiconductor integrated circuit, but may comprise a semiconductor integrated circuit which is formed by integrating a plurality of sub-chips by using a common multi-layer interconnect structure.

Several embodiments of a processing procedure of the method for the invention will be described below.

Figure 17:
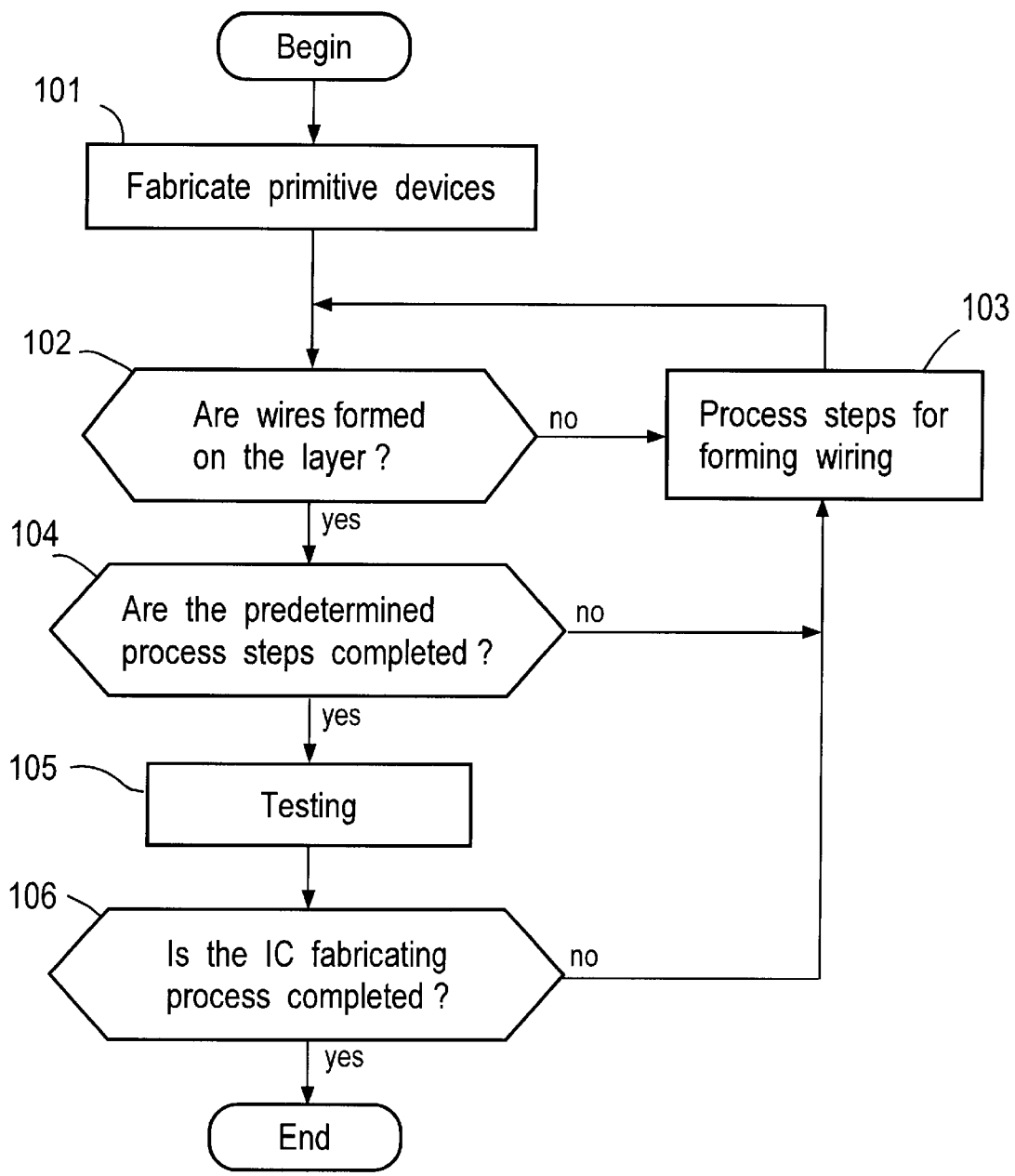
FIG. 17 is a flow chart showing a processing procedure in a method for fabricating a semiconductor integrated circuit according to the invention.

FIG. 17 shows an example of a processing procedure of the method for fabricating a semiconductor integrated circuit according to the invention. Initially, at step 101, a step of forming primitive devices (such as transistors) in a semiconductor substrate is performed. At step 102, a confirmation is made to see whether or not signal lines are formed on a layer surface, and if they are not formed, an interconnect layer stacking step shown at step 103 is used to form signal lines, and if the signal lines are formed, the operation proceeds to step 104.

At step 104, a confirmation is made to see whether or not at least one given step which is predetermined during the fabrication is completed, and if the given step is not completed, the interconnect layer stacking step at step 103 is repeated, and if the given step has been completed, the operation proceeds to step 105. It is to be noted that the interconnect layer stacking step at step 103 comprises a step of stacking a interconnect layer for primitive devices and sub-circuits, and may comprise process steps shown in FIG. 6, for example. Subsequently, at step 105, a plurality of primitive devices or subcircuits which have been formed and wired together up to said step are tested either sequentially or in parallel. Finally, at step 106, a confirmation is made to see whether or not the steps of fabricating a semiconductor integrated circuit have been completed. If the fabricating steps have not been completed, the steps 102, 103, 104 and 105 are repeated, and if the fabricating steps have been completed, the processing is completed. The testing step at step 105 may comprise a test for primitive devices, a test for smaller sub-circuits, a test for the relatively larger sub-circuits or the like, depending on the interconnection which has been completed up to that point and takes place each time each interconnect layer such as the second and a subsequent interconnect layer is formed. The test of primitive devices or sub-circuits may use an exhaustive test, a functional test, a stuck-at fault test, a delay fault test, a quiescent power supply power current test, a transient power supply current test, a parametric test or any other testing method. In particular, a test which takes place after the formation of each interconnect layer which follows the initial test may comprise only a wiring connection test.

Figure 7A:
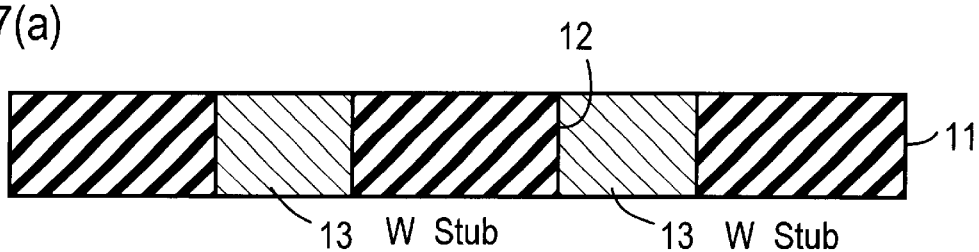
FIG. 7 shows cross sections illustrating another example of process steps of an interconnecting step.
Figure 7B:
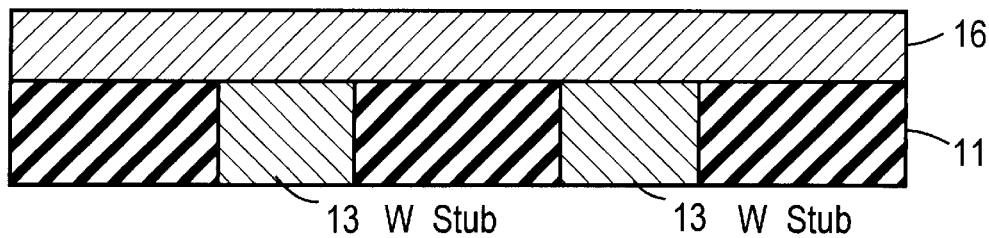
Figure 7C:
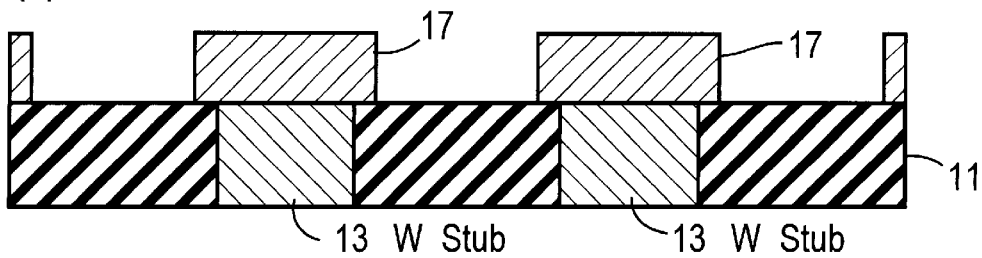
Figure 7D:
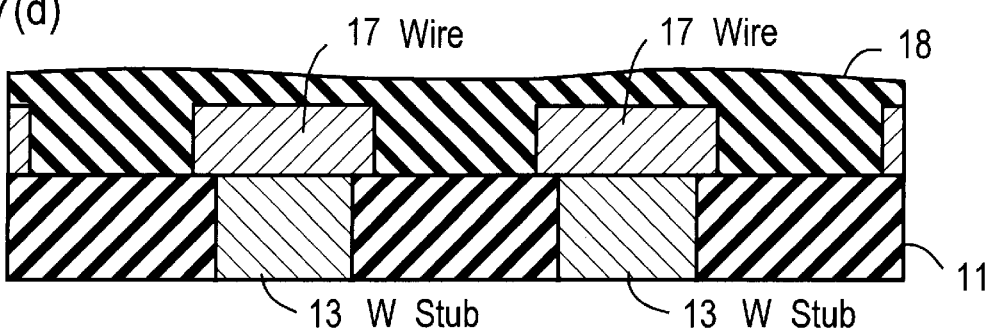
Figure 7E:
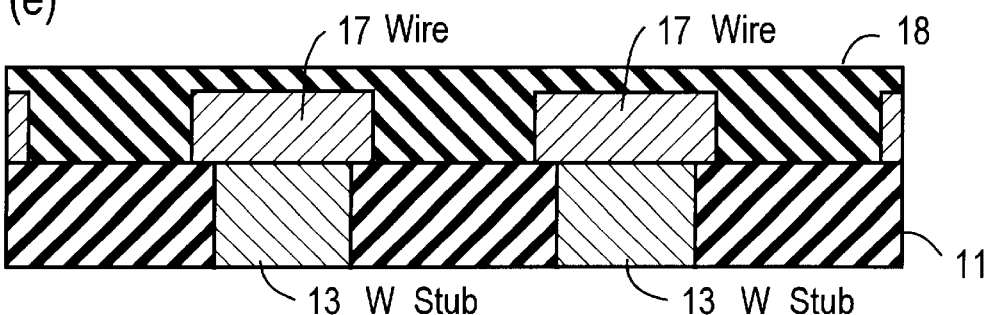
Figure 18:
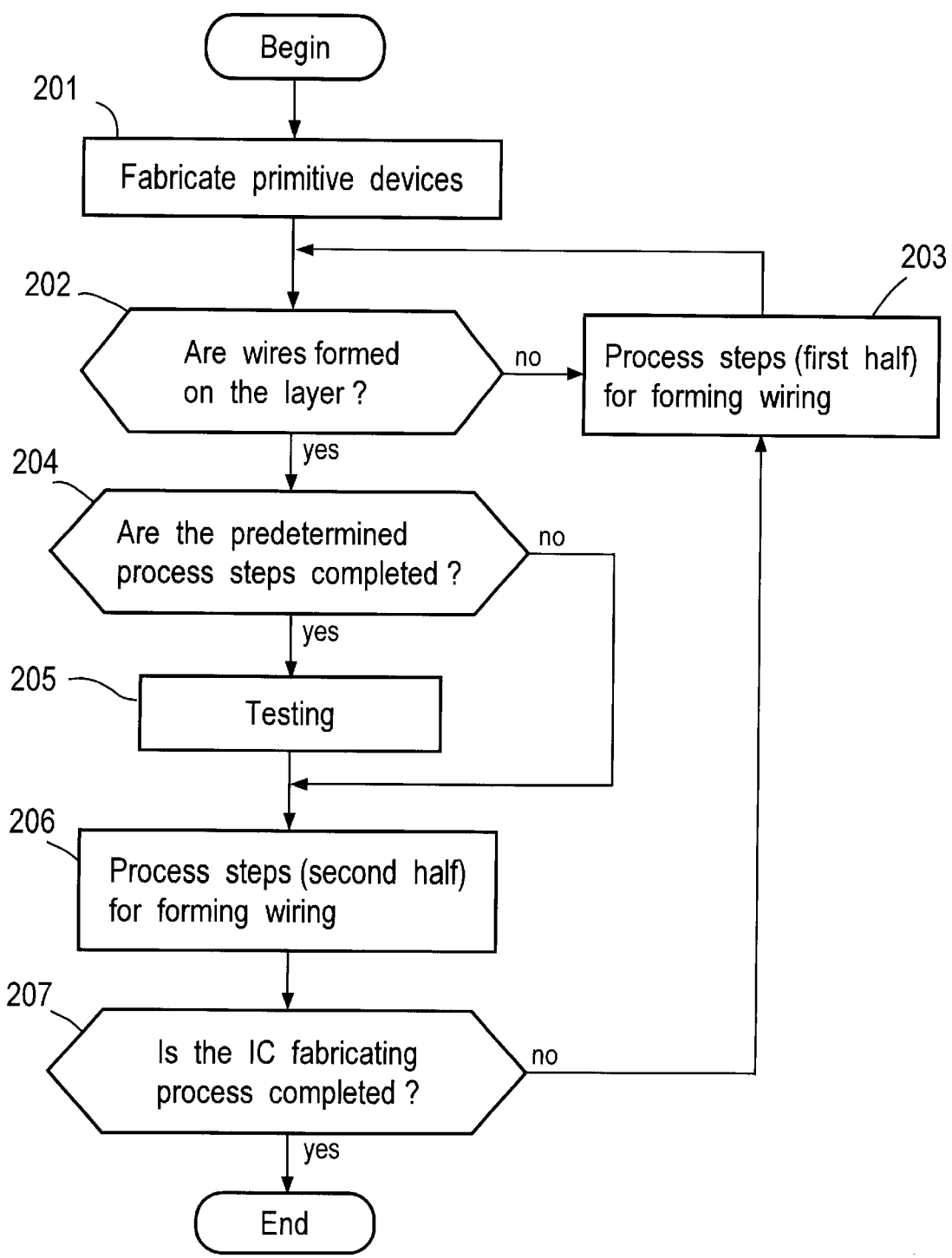
FIG. 18 is a flow chart showing another processing procedure in the method for fabricating a semiconductor integrated circuit according to the invention.

FIG. 18 shows another example of a processing procedure of the method for fabricating a semiconductor integrated circuit according to the invention. Initially, at step 201, a step of forming primitive devices (such as transistors) in a semiconductor substrate takes place. Then at step 202, a confirmation is made to see whether or not signal lines are formed on the surface of the interconnect layer, and if the signal lines are not formed, the signal lines are formed by an interconnect layer stacking step (first half), at step 203, which may comprise a process shown in FIGS. 7(a)–(c), for example, and if the signal lines are formed, the operation proceeds to step 204. Then at step 204, a confirmation is made to see whether or not a given step (not limited to one) has been completed, and if the given step has not been completed, the operation proceeds to an interconnect stacking step (second half) of step 206. However, if the given step has been completed at step 204, a plurality of primitive devices or sub-circuits which have been formed and wired together up to this point are tested either sequentially or in parallel at step 205. Subsequently, at step 206, an interconnect layer stacking step (second half) which may comprise a process shown in FIGS. 7(d), (e) is performed to complete the interconnecting step. Finally at step 207, a confirmation is made to see whether or not the steps of fabricating a semiconductor integrated circuit have been completed, and if the fabricating steps have not been completed, the steps 202, 203, 204, 205 and 206 are repeated while if the fabricating steps have been completed, the processing is completed. In the testing step which occurs at step 205, a test of primitive devices or sub-circuits may use an exhaustive test, a functional test, a stuck-at fault test, a delay fault test, a quiescent power supply current test, a transient power supply current test, a parametric test, a wiring connection test or any other testing method.

Figure 19:
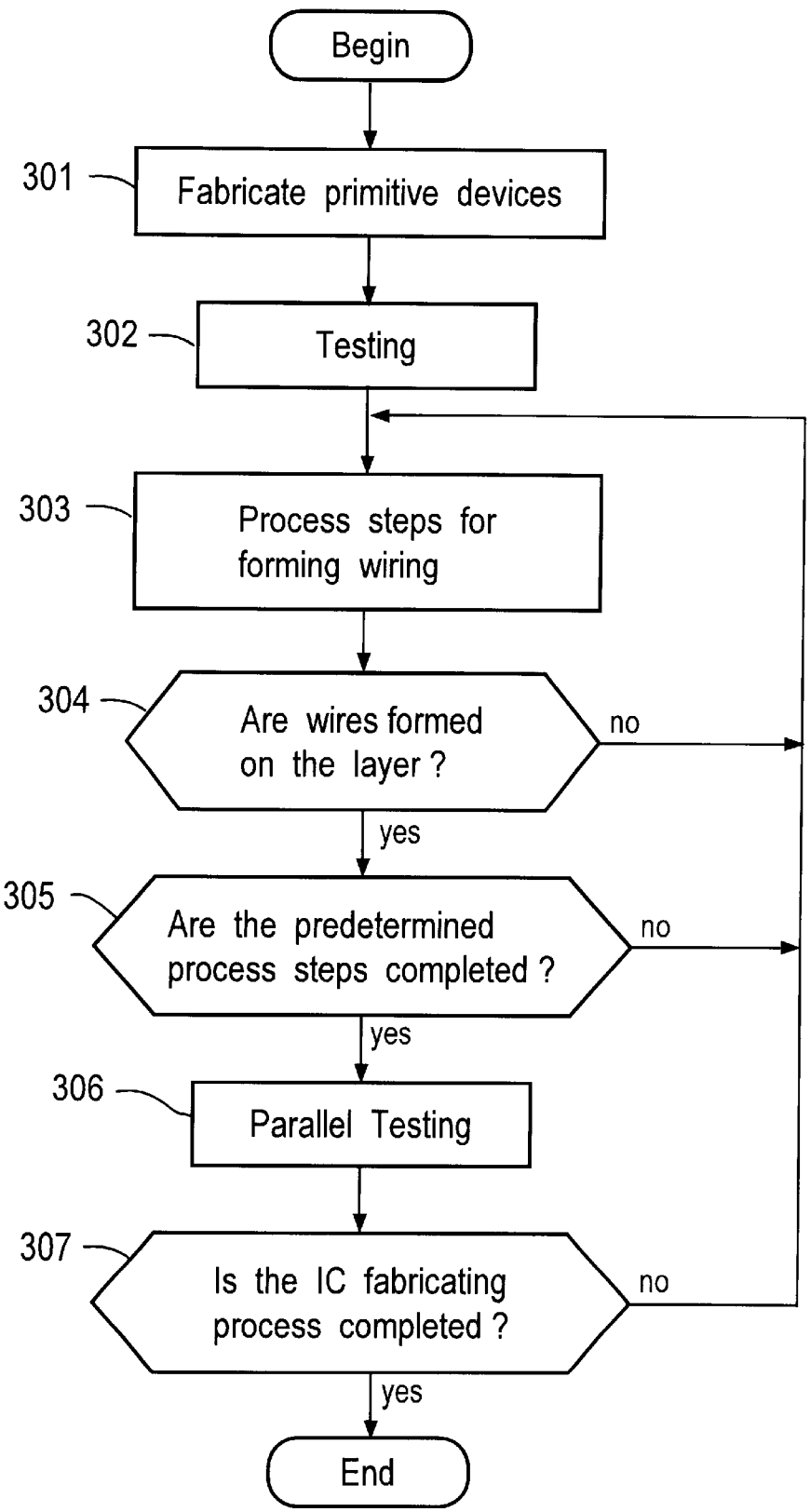
FIG. 19 is a flow chart showing a further processing procedure in the method for fabricating a semiconductor integrated circuit according to the invention.

FIG. 19 shows a further example of a processing procedure of the method for fabricating a semiconductor integrated circuit according to the invention. Initially, at step 301, a step of forming primitive devices (such as transistors) in a semiconductor substrate takes place. Then, at step 302, a test for the level of primitive devices or a parametric test which measures the element parameters of primitive devices takes place. Then, at step 303, signal lines are formed by an interconnect layer stacking step, and at step 304, a confirmation is made to see whether or not the signal lines are formed on the stacking surface, and if the signal lines are not formed, the operation returns to step 303, while if the signal lines are formed, the operation proceeds to step 305. At step 305, a confirmation is made to see whether or not a given step (not limited to one) has been completed. If the given step has not been completed, an interconnect layer stacking step at step 303 is repeated, while if the given step has been completed, the operation proceeds to step 306. It is to be noted that the interconnect layer stacking step at step 303 is one where an interconnect layer for the primitive devices or sub-circuits is formed by stacking, and which may comprise process steps as shown in FIG. 6, for example. Subsequently, at step 306, a plurality of primitive devices or sub-circuits which have been formed and wired together up to this point are tested either sequentially or in parallel. Finally, at step 307, a confirmation is made to see whether or not the steps of fabricating a semiconductor integrated circuit have been completed, and if the fabricating steps have not been completed, the steps 303, 304, 305 and 306 are repeated. However, if the fabricating steps have been completed, the processing is completed. In the testing step of step 306, a test of primitive devices or sub-circuits may use an exhaustive test, a functional test, a stuck-at fault test, a delay fault test, a quiescent power supply current test, a transient power supply current test, a parametric test, a wiring connection test or any other testing method.

Figure 20:
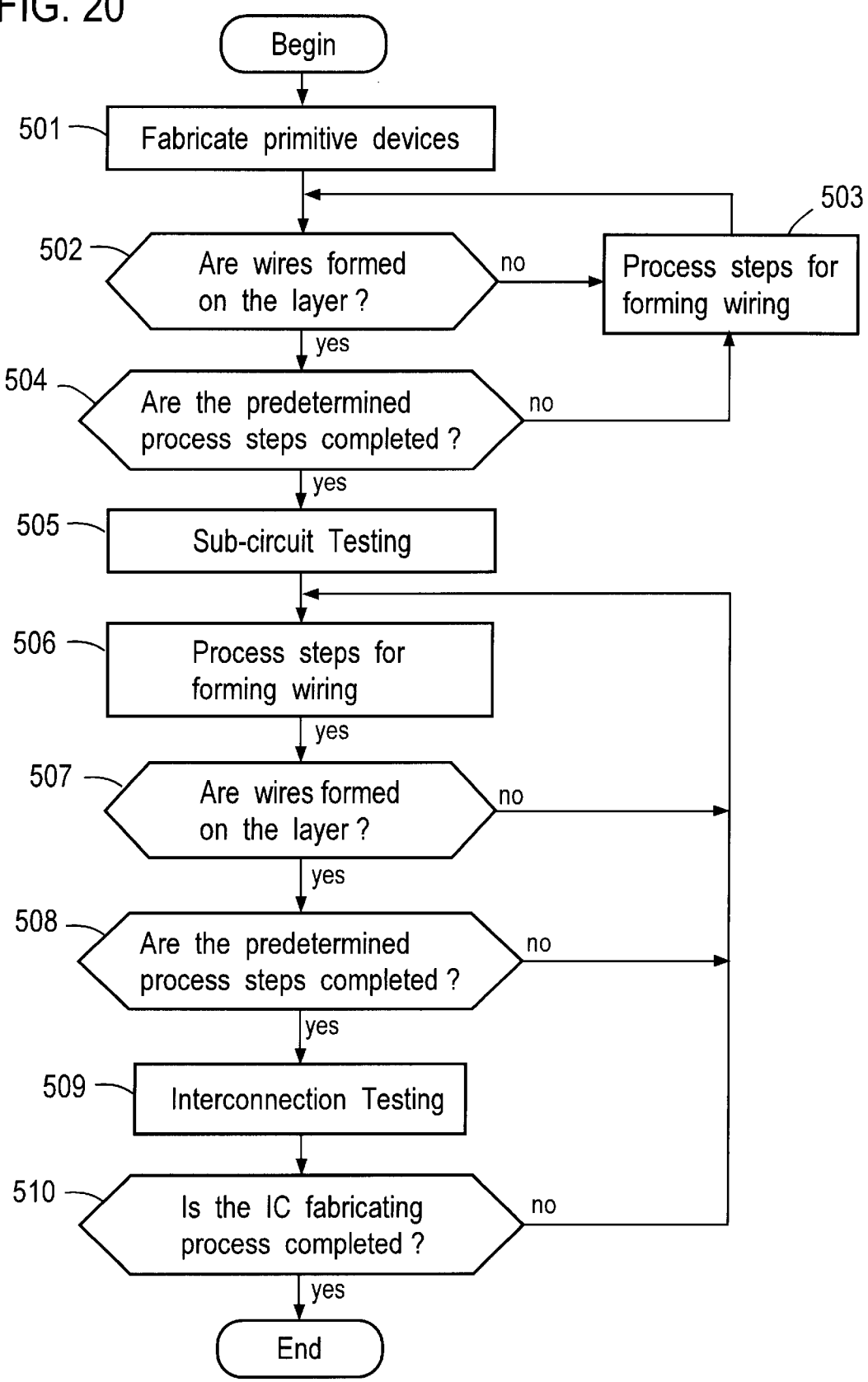
FIG. 20 is a flow chart showing an additional processing procedure in the method for fabricating a semiconductor integrated circuit according to the invention.

FIG. 20 shows an additional example of a processing procedure of the method for fabricating a semiconductor integrated circuit according to the invention. Initially, at step 501, a step of forming primitive devices (such as transistors) in a semiconductor substrate takes place. Then, at step 502, a confirmation is made to see whether or not signal lines are formed on the stacking surface, and if the signal lines are not formed, the signal lines are formed by the interconnect layer stacking step of step 503, while if the signal lines are formed, the operation proceeds to step 504. At step 504, a confirmation is made to see whether or not a given step has been completed and if the given step has not been completed, the interconnect layer stacking step of step 503 is repeated, while if the given step has been completed, the operation proceeds to step 505. It is to be noted that the interconnect layer stacking step of step 503 is one where the interconnect layer for the primitive devices or sub-circuits is formed by stacking and which may comprise the process steps shown in FIG. 6, for example. At next step 505, a test of the plurality of primitive devices or sub-circuits which have been formed and wired together up to this point takes place.

Subsequently, at step 506, an interconnect layer stacking step takes place again. The interconnect layer stacking step of step 506 is a step of forming an interconnect layer which wires together the plurality of primitive devices or sub-circuits that have been tested up to the step 505 to form a larger scale sub-circuit, and may comprise process steps shown in FIG. 6, for example. At next step 507, a confirmation is made to see whether or not signal lines are formed on the stacking surface, and if the signal lines are not formed, the interconnect layer stacking step of step 506 is used to form the signal lines. However, if the signal lines are formed, the operation proceeds to step 508. At step 508, a confirmation is made to see whether or not a given stacking step (which is not limited to one) has been completed, and if the given stacking step has not been completed, the stacking step of step 506 is repeated, while if the given stacking step has been completed, the operation proceeds to step 509. At step 509, a wiring connection test takes place with respect to a plurality of wirings extending between a plurality of sub-circuits which have been connected together up to the stacking step. Finally, at step 510, a confirmation is made to see whether or not the steps of fabricating a semiconductor integrated circuit have been completed, and if the fabricating steps have not been completed, the steps 506, 507, 508 and 509 are repeated, while if the fabricating steps have been completed, the processing is completed. In the sub-circuit testing step of step 505, a test of the primitive devices or sub-circuits may use an exhaustive test, a functional test, a stuck-at fault test, a delay fault test, a quiescent power supply current test, a transient power supply current test, a parametric test or any other testing method. In addition, the sub-circuit testing step of step 505 may test the plurality of sub-circuits sequentially, or may test them in parallel. In the similar manner, the wiring connection testing step of step 509 may test the plurality of wiring connections sequentially or may test them in parallel. It is preferred that the wiring connection test of step 509 be conducted each time an interconnect layer stacking step which follows the step 505 has been completed. In this instance, step 508 may be omitted.

Figure 21:
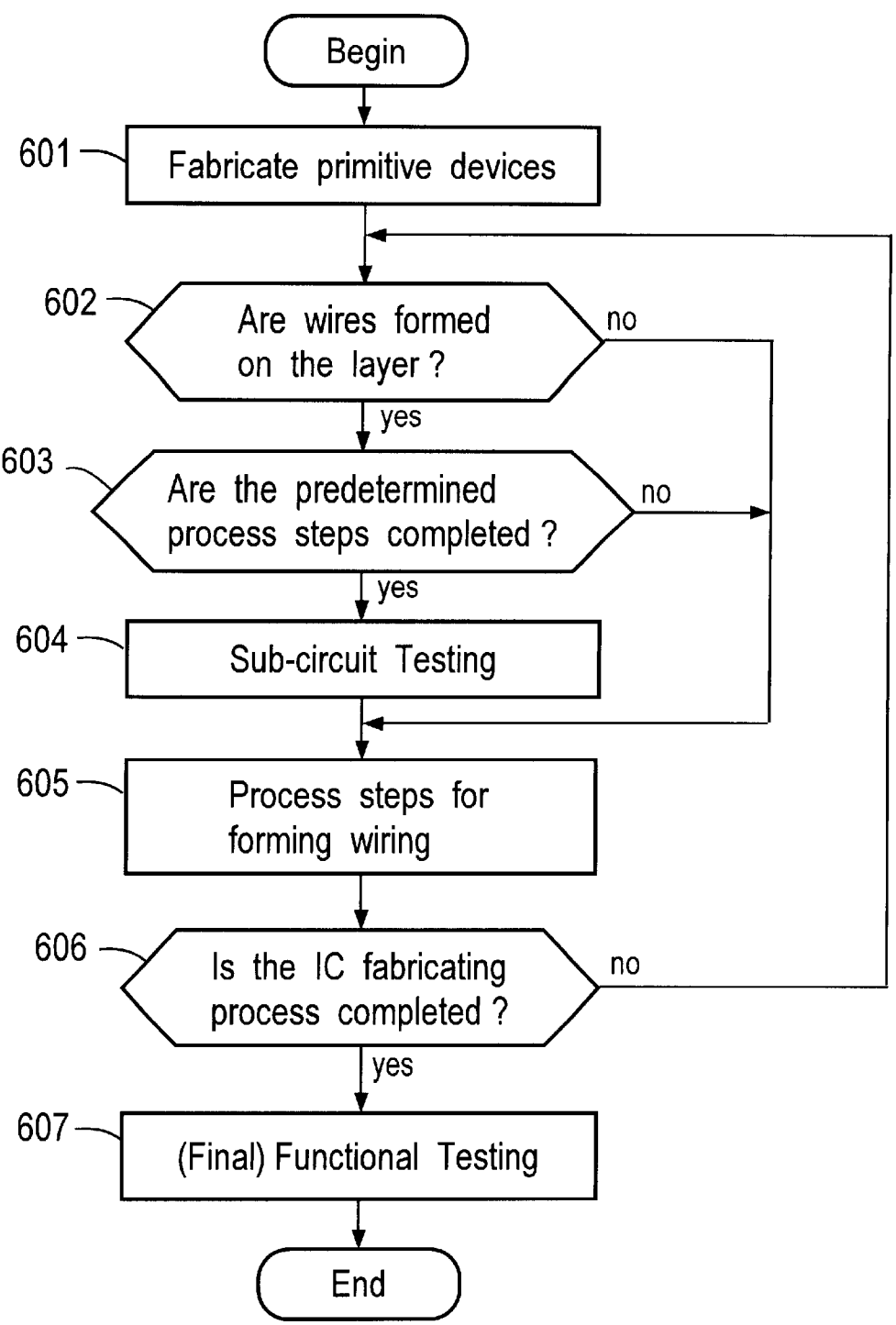
FIG. 21 is a flow chart showing still another processing procedure in the method for fabricating a semiconductor integrated circuit according to the invention.

FIG. 21 shows still another example of a processing procedure of the method for fabricating a semiconductor integrated circuit according to the invention. Initially, at step 601, a step of forming primitive devices (such as transistors) in the semiconductor substrate during the steps of manufacturing a semiconductor integrated circuit takes place. At next step 602, a confirmation is made to see whether or not signal lines are formed on the stacking surface, and if the signal lines are not formed, the operation proceeds to an interconnect layer stacking step of step 605, while if the signal lines are formed, the operation proceeds to step 603. At step 603, a confirmation is made to see whether or not a given step (which is not limited to one) has been completed, and if the given step has not been completed, the operation proceeds to the interconnect layer stacking step of step 605, while if the given step has been completed, the operation proceeds to step 604. At step 604, a test of the plurality of primitive devices or sub-circuits which have been formed and wired together up to this point takes place.

Subsequently, at step 605, an interconnect layer stacking step takes place, thus forming signal lines on the surface of the interconnect layer. It is to be noted that the interconnect layer stacking step of step 605 is one in which a wiring between the primitive devices or sub-circuit is made by stacking, and which may comprise process steps shown in FIG. 6, for example. Then, at step 606, a confirmation is made to see whether or not the steps of fabricating a semiconductor integrated circuit have been completed, and if the fabricating steps have not been completed, the steps 602, 603, 604 and 605 are repeated, while if the fabricating steps have been completed, the operation proceeds to step 607. Finally, at step 607, a final functional test (functional test) of finally integrated semiconductor integrated circuit takes place to complete the processing. In the sub-circuit testing step of step 604, a test of the primitive devices or sub-circuits may use an exhaustive test, a functional test, a stuck-at fault test, a delay fault test, a quiescent power supply current test, a transient power supply current test, a parametric test or any other testing method. In addition, the sub-circuits testing step of step 604 may test the plurality of sub-circuits sequentially or may test them in parallel. In addition, the final functional testing step of step 606 may use a testing method other than the functional test, as required. The final test of step 607 may take place by placing a probe in contact with a bonding pad on the semiconductor integrated circuit, or may take place with respect to a packaged semiconductor integrated circuit.

Figure 22:
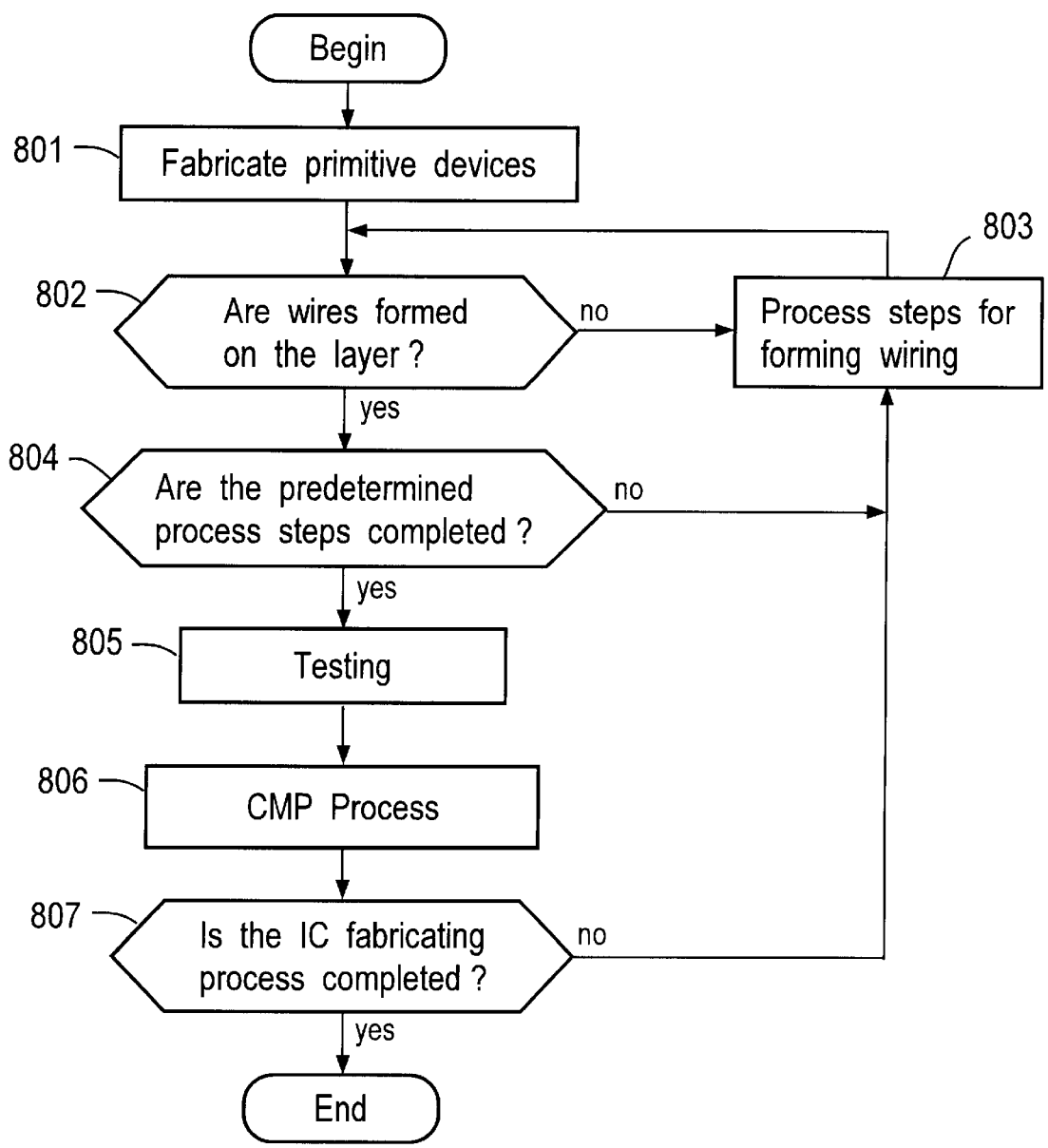
FIG. 22 is a flow chart showing a still further processing procedure in the method for fabricating a semiconductor integrated circuit according to the invention.

FIG. 22 shows a still further example of a processing procedure of the method for fabricating a semiconductor integrated circuit according to the invention. Initially, at step 801, a step of forming primitive devices (such as transistors) in a semiconductor substrate takes place. Then, at step 802, a confirmation is made to see if signal lines are formed on the stacking surface, and if the signal lines are not formed, an interconnect layer stacking step of step 803 is used to form the signal lines, while if the signal lines are formed, the operation proceeds to step 804. At step 804, a confirmation is made to see whether or not a given step (which is not limited to one) has been completed, and if the given step has not been completed, the interconnect layer stacking step of step 803 is repeated, while if the given step has been completed, the operation proceeds to step 805.

It is to be noted that the interconnect layer stacking step of step 803 is one in which the wiring for the primitive devices or sub-circuits is formed by stacking and which may comprise process steps shown in FIG. 6, for example. Subsequently, at step 805, a test of the plurality of primitive devices or sub-circuits which have been formed and wired together up to this point takes place. Then at step 806, a CMP planarizing step takes place. Purpose of CMP planarizing step 806 is to remove minuscule scars of contact which may be formed when a probe is placed in contact at the testing step 805 or to remove a wiring to the testing circuit used for the test facilitating design technique which may have been used in the testing step 805. Finally, at step 807, a confirmation is made to see whether or not the steps of fabricating a semiconductor integrated circuit have been completed, and if the fabricating steps have not been completed, the steps 802, 803, 804, 805 and 806 are repeated, while if the fabricating steps have been completed, the processing is completed. In the testing step of step 805, the test of the primitive devices or the sub-circuits may use an exhaustive test, a functional test, a stuck-at fault test, a delay fault test, a quiescent power supply current test, a transient power supply current test, a parametric test, a wiring connection test or any other testing method. In addition, the testing step of step 805 may test the plurality of sub-circuits sequentially or may test them in parallel.

The interconnect layer stacking step in each of steps 503 and 506 in FIG. 20, the step 605 in FIG. 21 and the step 803 in FIG. 22 may use a process shown in FIG. 7. In this instance, the interconnect layer stacking step may be divided into a first half step and a second half step, as shown in the embodiment of FIG. 18, and where the test takes place at a given step, it may take place after the completion of the first half step, and may be followed by the second half step.

As described above, with the method for fabricating a semiconductor integrated circuit according to the present invention, a test for the level of sub-circuits may be performed in the course of fabricating a semiconductor integrated circuit with a multi-layered interconnect structure, thus allowing the number of test patterns and the testing cost to be reduced to provide a significant improvement in the economical effect of a large scale semiconductor integrated circuit testing.

Also, with the method for fabricating a semiconductor integrated circuit according to the invention, a test for the level of sub-circuits in the course of steps of manufacturing a semiconductor integrated circuit with a multi-layered interconnect structure allows a testing method which would be inapplicable to a large scale integrated circuit to be used, thus significantly improving a fault coverage.

Also, with the method for fabricating a semiconductor integrated circuit according to the invention, a test for the level of sub-circuits in the course of fabricating a semiconductor integrated circuit with a multi-layered interconnect structure dispenses with the test facilitating design technique which may be used to improve the ease of testing sub-circuits, allowing an area overhead for the testing circuit to be reduced to null.

Also, with the method for fabricating a semiconductor integrated circuit according to the invention, a test for the level of sub-circuits in the course of fabricating a semiconductor integrated circuit with a multi-layered interconnect structure enables a parallel testing of wirings between the subcircuits or between a system and sub-circuits located on the same chip as the system functions, thus allowing a testing time interval and a testing cost to be reduced and allowing a semiconductor integrated circuit which is free from faults to be fabricated in a reduced length of time.

Also, with the method for fabricating a semiconductor integrated circuit according to the invention, a test for the level of sub-circuits in the course of fabricating a semiconductor integrated circuit with a multi-layered interconnect structure enables an early detection of poor works such as disconnection faults or short-circuit faults and malfunctioning which would cause an out-of-specification circuit performance, thus allowing a testing cost and a fabricating cost for the semiconductor integrated circuit to be reduced.

Also, with the method for fabricating a semiconductor integrated circuit according to the invention, a test for the level of sub-circuits in the course of fabricating a semiconductor integrated circuit with a multi-layered interconnect structure allows sub-systems which are highly likely to cause failures to be identified, and such information may be used to incorporate the test facilitating design technique or to improve the reliability of the overall system, thus allowing a system repair interval of an increased length (a time interval required to repair a faulty system into a normal system) to be reduced.

Also, with the method for fabricating a semiconductor integrated circuit according to the invention, a test for the level of sub-circuits in the course of fabricating a semiconductor integrated circuit with a multi-layered interconnect structure enables the acquisition of performance data such as delay times or current driving capabilities on the device level or the subsystem level which would be necessary in the simulation or modeling to improve the system performance.

Also, with the method for fabricating a semiconductor integrated circuit according to the invention, a test for the level of sub-circuits in the course of manufacturing a semiconductor integrated circuit with a multi-layered interconnect structure enables that the assurance for acceptable components be given which satisfy KGD (known good die) standard demands upon the final test, thus allowing KGD cost to be significantly reduced.

Also, with the method for fabricating a semiconductor integrated circuit according to the invention, if the test facilitating design technique is incorporated into a semiconductor integrated circuit with a multi-layered interconnect structure, after the testing circuit according to the test facilitating design technique has been used to perform a test, the wiring for the testing circuit which is used in the testing step may be removed by utilizing CMP (chemical mechanical polishing) planarizing step to reconfigure the circuit, thus preventing a degradation in the performance of the semiconductor integrated circuit under test which may be caused by the test facilitating design technique from occuring.

What is claimed is:

1. A method for fabricating a semiconductor integrated circuit by performing an interconnect layer stacking step a plurality of times after primitive devices have been formed, wherein a testing step of testing one or more primitive devices or sub-circuits which are wired together during at least one or more intermediate stacking step comprises a first testing step in which a test of one or more primitive devicesor sub-circuits which are wired together takes place, and a second testing stepin which a wiring connection test is made with respect to wirings which are formed between the primitive devices or sub-circuits as a result of an interconnect layer stacking step which follows the first testing step.

2. A method for fabricating a semiconductor integrated circuit by performing an interconnect layer stacking step a plurality of times after primitive devices have been formed, comprising a testing step of testing one or more primitive devices or sub-circuits which are wired together during at least one or more intermediate stacking step;

a step of confirming whether or not a given step has been completed upon termination of a stacking step, upon confirming the completion of the given step, beginning the testing step, and if the given step has not been completed, entering a succeeding stacking step;

and a step of confirming whether or not the steps of fabricating a semiconductor integrated circuit have been completed upon termination of the testing step and if the fabricating steps have been completed, entering a succeeding stacking step.

3. A method for fabricating a semiconductor integrated circuit by performing an interconnect layer stacking step a plurality of times after primitive devices have been formed, comprising a testing step of testing one or more primitive devices or sub-circuits which are wired together during at least one or more intermediate stacking step;

a step of confirming whether or not a given step has been completed upon termination of a stacking step, upon confirming that the given step has been completed, transferring to a testing process (a first testing step) of testing a plurality of primitive devices or sub-circuits which have been formed and wired together up to this point, and if the given step has not been completed, transferring to a succeeding stacking step;

a step of transferring to a succeeding interconnect layer stacking step upon termination of the first testing step;

a step of subsequently confirming whether or not a given stacking step has been completed, upon confirming that the given stacking step has been completed, transferring to a second testing step in which a wiring connection test for a plurality of wirings between a plurality of sub-circuits which have been connected together up to this point takes place, and if the given stacking step have not been completed, transferring to a succeeding stacking step;

and a step of confirming whether or not the steps of fabricating a semiconductor integrated circuit have been completed upon termination of the second testing step, and if the steps of fabricating have not been completed, transferring to a succeeding stacking step which follows the first testing step.

4. A method for fabricating a semiconductor integrated circuit by performing an interconnect layer stacking step comprising a first half step and a second half step a plurality of times after primitive devices have been formed, comprising a testing step of testing one or more primitive devices or sub-circuits which are wired together during at least one or more intermediate stacking step;

a step of confirming whether or not a given step has been completed upon termination of the first half step of the stacking step, if the given step has not been completed, transferring to the second half step of the stacking step, and upon confirming that the given step has been completed, transferring to the testing step;

a step of transferring to the second half step of the stacking step upon termination of the testing step;

and a step of confirming whether or not steps of fabricating a semiconductor integrated circuit have been completed upon termination of the second half step of the stacking step, and if the steps of fabricating have not been completed, transferring to the first half step of the succeeding stacking step.

* * * * *